US012580523B2

(12) United States Patent
Eroglu et al.

(10) Patent No.: US 12,580,523 B2
(45) Date of Patent: Mar. 17, 2026

(54) POWER ENHANCED HYBRID CHIREIX-DOHERTY AMPLIFIER

(71) Applicant: North Carolina Agricultural and Technical State University, Greensboro, NC (US)

(72) Inventors: Abdullah Eroglu, Oak Ridge, NC (US); Emilio Ruiz-Linares, Greensboro, NC (US)

(73) Assignee: North Carolina Agricultural and Technical State University, Greensboro, NC (US)

( * ) Notice: Subject to any disclaimer, the term of this patent is extended or adjusted under 35 U.S.C. 154(b) by 414 days.

(21) Appl. No.: 18/112,096

(22) Filed: Feb. 21, 2023

(65) Prior Publication Data

US 2023/0268889 A1       Aug. 24, 2023

Related U.S. Application Data

(60) Provisional application No. 63/312,199, filed on Feb. 21, 2022.

(51) Int. Cl.
*H03F 1/02* (2006.01)
*H03F 1/56* (2006.01)
(Continued)

(52) U.S. Cl.
CPC ............. *H03F 1/0288* (2013.01); *H03F 1/56* (2013.01); *H03F 3/245* (2013.01); *H03F 3/265* (2013.01);
(Continued)

(58) Field of Classification Search
CPC .......... H03F 1/0288; H03F 1/56; H03F 3/245; H03F 3/265; H03F 3/604; H03F 2200/451; H03F 2200/541
(Continued)

(56) References Cited

U.S. PATENT DOCUMENTS 6,359,506 B1 * 3/2002 Camp, Jr. ............. H03F 1/0288
332/149
7,221,219 B2 5/2007 Hellberg et al.
(Continued)

FOREIGN PATENT DOCUMENTS

EP 1068666 B1 * 5/2003 ........... H03F 1/0294

OTHER PUBLICATIONS

Calvillo-Cortes et al. (2013) "A 70W package-integrated class-E Chireix outphasing RF power amplifier," IEEE MTT-S International Microwave Symposium Digest (MTT), pp. 1-3.
(Continued)

*Primary Examiner* — Hafizur Rahman
(74) *Attorney, Agent, or Firm* — Jenkins, Taylor & Hunt, P.A.

(57) ABSTRACT

In some examples, a hybrid Chireix-Doherty amplifier comprises a first and second input network, a main amplifier coupled to a first output of the first input network, an auxiliary amplifier coupled to a second output of the second input network, and a combiner network. The combiner network is coupled to a first output of the main amplifier and an output of the auxiliary amplifier. The combiner network includes an output node for coupling to a load, e.g., an antenna of a base station for a radio network. The main amplifier is implemented as an inverse class-F amplifier.

20 Claims, 24 Drawing Sheets

(51) Int. Cl.
  *H03F 3/24*     (2006.01)
  *H03F 3/26*     (2006.01)
  *H03F 3/60*     (2006.01)
(52) U.S. Cl.
  CPC ....... *H03F 3/604* (2013.01); *H03F 2200/451*
      (2013.01); *H03F 2200/541* (2013.01)
(58) Field of Classification Search
  USPC ...................................................... 330/124 R
  See application file for complete search history.

(56)                References Cited

U.S. PATENT DOCUMENTS

| | | | |
|---|---|---|---|
| 8,384,475 B2 | 2/2013 | Gustavsson et al. | |
| 9,882,535 B2 | 1/2018 | Jang et al. | |
| 2020/0083848 A1* | 3/2020 | Zhou ..................... | H03F 3/3001 |

OTHER PUBLICATIONS

He et al. (2015) "A wideband 700W push-pull Doherty amplifier," IEEE MTT-S International Microwave Symposium, pp. 1-4.

Jundi et al. (2020) "A series-connected-load Doherty power amplifier with push-pull main and auxiliary amplifiers for base station applications," IEEE Transactions on Microwave Theory and Techniques, vol. 68, No. 2, pp. 796-807.

Liang et al. (2019) "Novel outphasing power amplifiers designed with an analytic generalized Doherty-Chireix continuum theory," IEEE Transactions on Circuits and Systems I: Regular Papers, vol. 66, No. 8, pp. 2935-2948.

Niubó-Alemán et al. (2021) "Time-domain characterization and linearization of a dual-input power amplifier using a vector network analyzer as the receiver," IEEE Transactions on Microwave Theory and Techniques, vol. 69, No. 4, pp. 2386-2398.

Qureshi et al. (2016) "A 112W GaN dual input Doherty-outphasing power amplifier," IEEE MTT-S International Microwave Symposium (IMS), pp. 1-4.

Roblin et al. (2015) "Transistor characterization and modeling and the use of embedding device models for the design of microwave power amplifiers," Integrated Nonlinear Microwave and Millimetre-wave Circuits Workshop (INMMiC), IEEE, pp. 1-6.

* cited by examiner

MAIN TRANSISTOR PROJECTED TO PRP

AUX TRANSISTOR PROJECTED TO PRP

HCD PUSH-PULL MAIN BRANCH INPUT MATCH
OPTIMIZATION SETUP

HCD PUSH-PULL AUX BRANCH INPUT MATCH
OPTIMIZATION SETUP

Figure 15A:
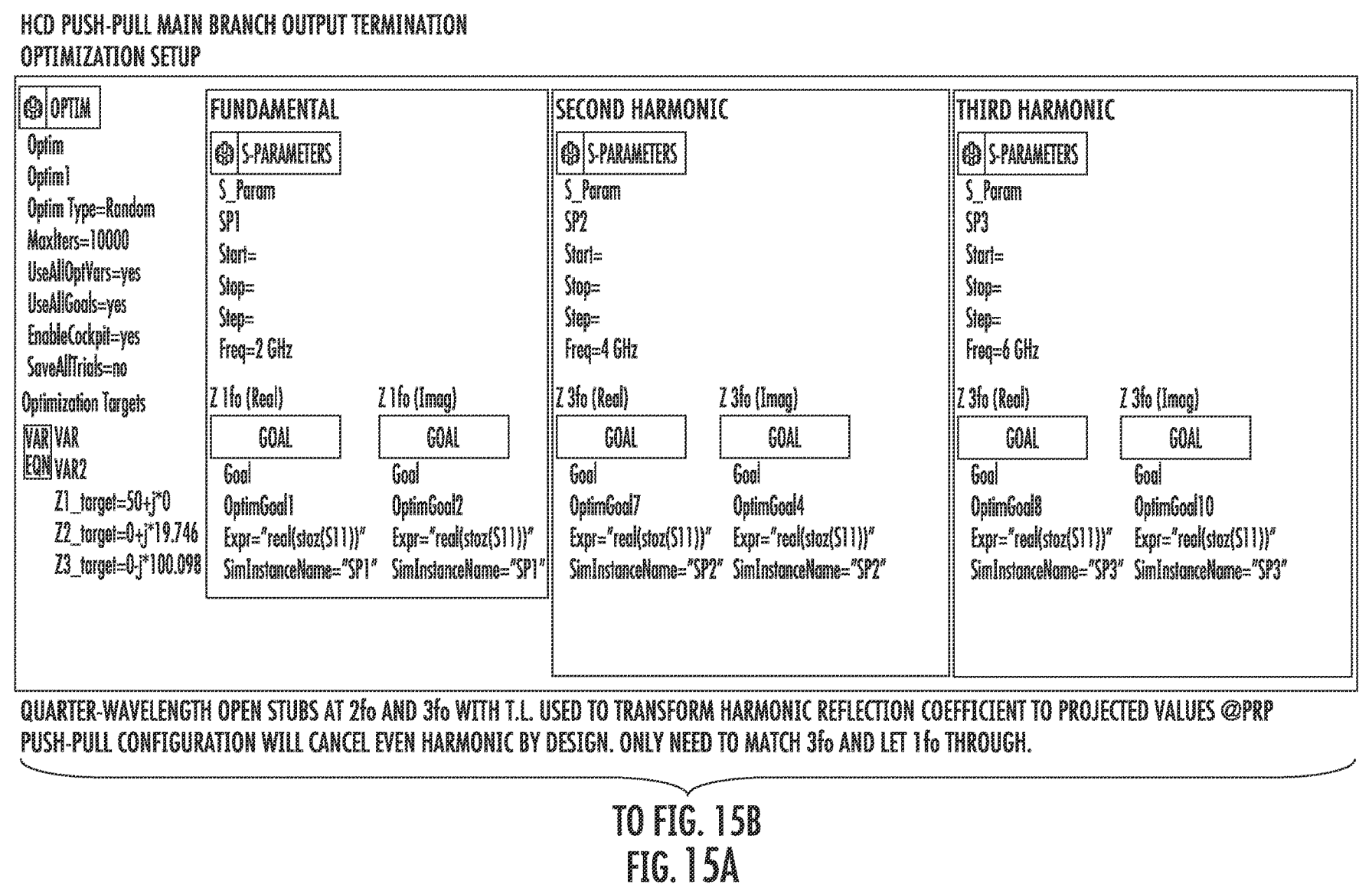

HCD PUSH-PULL MAIN BRANCH OUTPUT TERMINATION
OPTIMIZATION SETUP

OPTIM
Optim
Optim1
Optim Type=Random
MaxIters=10000
UseAllOptVars=yes
UseAllGoals=yes
EnableCockpit=yes
SaveAllTrials=no Optimization Targets
VAR VAR
EQN VAR2
Z1_target=50+j70
Z2_target=0+j*19.746
Z3_target=0-j*100.098

FUNDAMENTAL

S-PARAMETERS
S_Param
SP1
Start=
Stop=
Step=
Freq=2 GHz

Z 1fo (Real)
GOAL
Goal
OptimGoal1
Expr="real(stoz(S11))"
SimInstanceName="SP1"

Z 1fo (Imag)
GOAL
Goal
OptimGoal2
Expr="real(stoz(S11))"
SimInstanceName="SP1"

SECOND HARMONIC

S-PARAMETERS
S_Param
SP2
Start=
Stop=
Step=
Freq=4 GHz

Z 3fo (Real)
GOAL
Goal
OptimGoal7
Expr="real(stoz(S11))"
SimInstanceName="SP2"

Z 3fo (Imag)
GOAL
Goal
OptimGoal4
Expr="real(stoz(S11))"
SimInstanceName="SP2"

THIRD HARMONIC

S-PARAMETERS
S_Param
SP3
Start=
Stop=
Step=
Freq=6 GHz

Z 3fo (Real)
GOAL
Goal
OptimGoal8
Expr="real(stoz(S11))"
SimInstanceName="SP3"

Z 3fo (Imag)
GOAL
Goal
OptimGoal10
Expr="real(stoz(S11))"
SimInstanceName="SP3"

QUARTER-WAVELENGTH OPEN STUBS AT 2fo AND 3fo WITH T.L. USED TO TRANSFORM HARMONIC REFLECTION COEFFICIENT TO PROJECTED VALUES @PRP PUSH-PULL CONFIGURATION WILL CANCEL EVEN HARMONIC BY DESIGN. ONLY NEED TO MATCH 3fo AND LET 1fo AND THROUGH.

FROM FIG. 15A

Figure 16A:
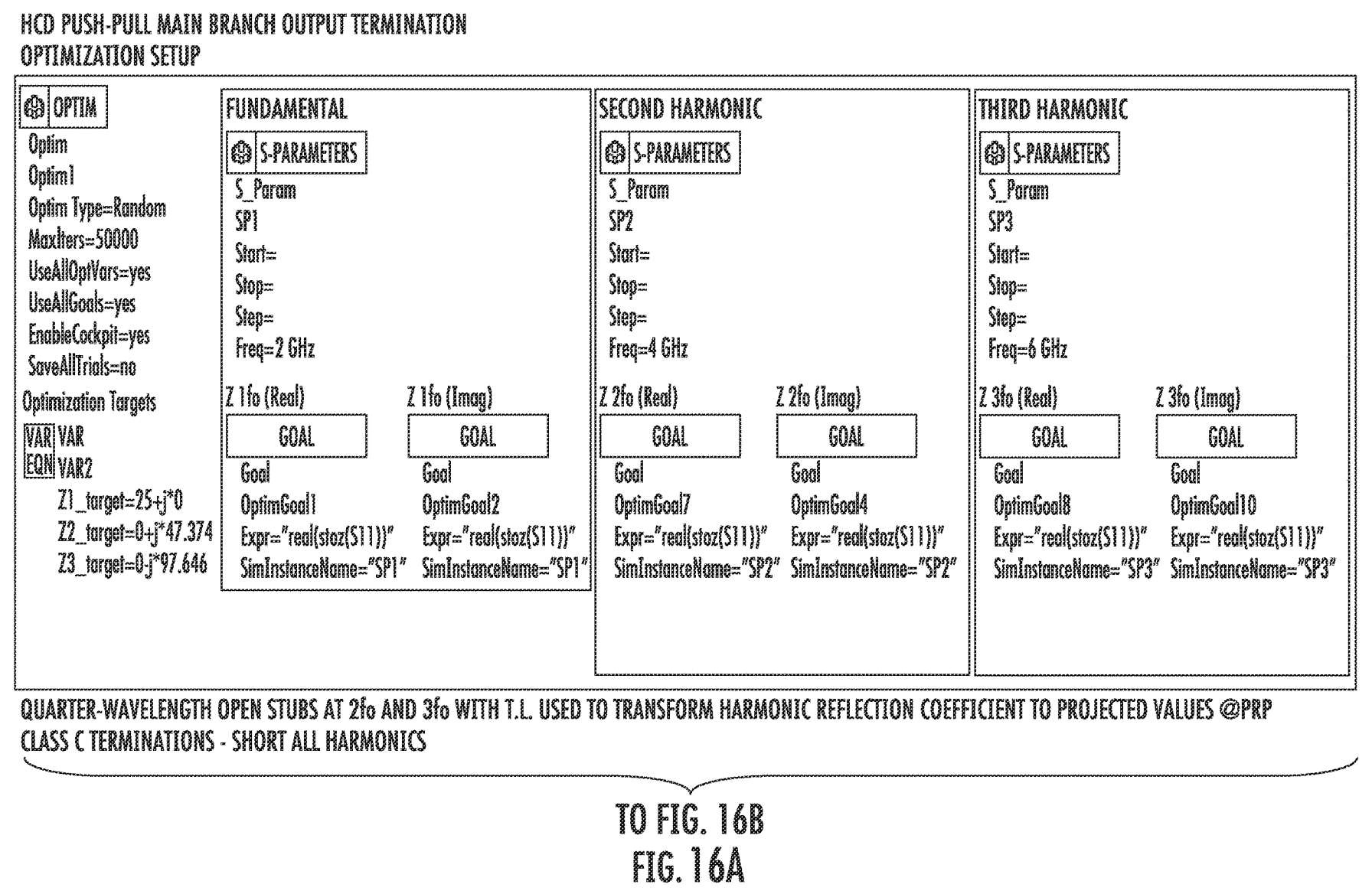

HCD PUSH-PULL MAIN BRANCH OUTPUT TERMINATION
OPTIMIZATION SETUP

OPTIM
Optim
Optim1
Optim Type=Random
MaxIters=50000
UseAllOptVars=yes
UseAllGoals=yes
EnableCockpit=yes
SaveAllTrials=no Optimization Targets
VAR VAR2
EQN VAR2
$Z1\_target=25+j*0$
$Z2\_target=0+j*47.374$
$Z3\_target=0-j*97.646$ FUNDAMENTAL
S-PARAMETERS
S_Param
SP1
Start=
Stop=
Step=
Freq=2 GHz Z 1fo (Real) GOAL
Goal
OptimGoal1
Expr="real(stoz(S11))"
SimInstanceName="SP1"

Z 1fo (Imag) GOAL
Goal
OptimGoal2
Expr="real(stoz(S11))"
SimInstanceName="SP1"

SECOND HARMONIC
S-PARAMETERS
S_Param
SP2
Start=
Stop=
Step=
Freq=4 GHz

Z 2fo (Real) GOAL
Goal
OptimGoal7
Expr="real(stoz(S11))"
SimInstanceName="SP2"

Z 2fo (Imag) GOAL
Goal
OptimGoal4
Expr="real(stoz(S11))"
SimInstanceName="SP2"

THIRD HARMONIC
S-PARAMETERS
S_Param
SP3
Start=
Stop=
Step=
Freq=6 GHz

Z 3fo (Real) GOAL
Goal
OptimGoal8
Expr="real(stoz(S11))"
SimInstanceName="SP3"

Z 3fo (Imag) GOAL
Goal
OptimGoal10
Expr="real(stoz(S11))"
SimInstanceName="SP3"

QUARTER-WAVELENGTH OPEN STUBS AT 2fo AND 3fo WITH T.L. USED TO TRANSFORM HARMONIC REFLECTION COEFFICIENT TO PROJECTED VALUES @PRP
CLASS C TERMINATIONS - SHORT ALL HARMONICS

FROM FIG. 16A

POWER ENHANCED HYBRID CHIREIX-DOHERTY AMPLIFIER

CROSS-REFERENCE TO RELATED APPLICATIONS

This application claims benefit of U.S. Provisional Application Ser. No. 63/312,199, filed on Feb. 21, 2022, the disclosure of which is incorporated herein by reference in its entirety.

TECHNICAL FIELD

This specification relates generally to power amplifiers and more particularly to hybrid Chireix-Doherty amplifiers.

BACKGROUND

Power amplifiers usually used in radio transmitters for broadcast, cellular, and satellite systems, are indispensable components that are typically designed to be efficient and linear, in addition to being able to simultaneously amplify many radio channels (frequencies) or independent user data channels, spread across a fairly wide bandwidth. A power amplifier, such as a radio frequency (RF) power amplifier, also has to perform amplifications efficiently in order to reduce power consumption and to increase its longevity.

Two amplifier structures have been widely utilized. The Doherty amplifier (or the Doherty amplification method), is described in W. H. Doherty, "*A new high efficiency power amplifier for modulated waves,*" Proc. IRE, vol. 24, no. 9, pp. 1163-1182, September 1936, and the Chireix outphasing system (or the Chireix amplification method) is described in H. Chireix, "*High power outphasing modulation*", Proc. IRE, vol. 23, no. 11, pp. 1370-392, November 1935.

The Doherty amplifier uses one non-linear and one linear amplifier. A first power amplifier is driven as a linear amplifier in class B, and a second power amplifier having non-linear output current modulates the impedance seen by the first amplifier, through an impedance-inverting quarter wave line. Since the non-linear output current of the second power amplifier is zero below a certain output voltage, the second power amplifier does not contribute to power loss below this voltage.

A Chireix amplifier is typically configured to create amplitude modulation using two amplifiers operating at constant amplitude together with a special type of combining network. By altering the differential phase-shift between the two amplifiers, amplitude modulation is created. After up-conversion and amplification through RF chains (e.g., using mixers, filters and amplifiers), the signals are combined to form an amplified signal in an output combiner network. The phases of these constant amplitude signals are chosen so that the result from their vector-summation yields the desired amplitude.

SUMMARY

This specification describes hybrid Chireix-Doherty amplifiers and methods for designing and operating hybrid Chireix-Doherty amplifiers. In some examples, a hybrid Chireix-Doherty amplifier comprises first and second input networks, a main amplifier coupled to a first output of the first input network, an auxiliary amplifier coupled to a second output of the second input network, and a combiner network. The combiner network is coupled to an output of the main amplifier and an output of the auxiliary amplifier.

The combiner network includes an output node for coupling to a load, e.g., an antenna of a base station for a radio network. The main amplifier is implemented as an inverse class-F amplifier.

The computer systems described in this specification may be implemented in hardware, software, firmware, or any combination thereof. In some examples, the computer systems may be implemented using a computer readable medium having stored thereon computer executable instructions that when executed by the processor of a computer control the computer to perform steps. Examples of suitable computer readable media include non-transitory computer readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF DRAWINGS

FIGS. 15A-15B show optimization test bench and final values for the main output matching network.

FIGS. 16A-16B show the optimization test bench and final values for the auxiliary output matching network.

DETAILED DESCRIPTION

This specification describes hybrid Chireix-Doherty (HCD) amplifiers and methods for designing and operating HCD amplifiers.

Figure 1:
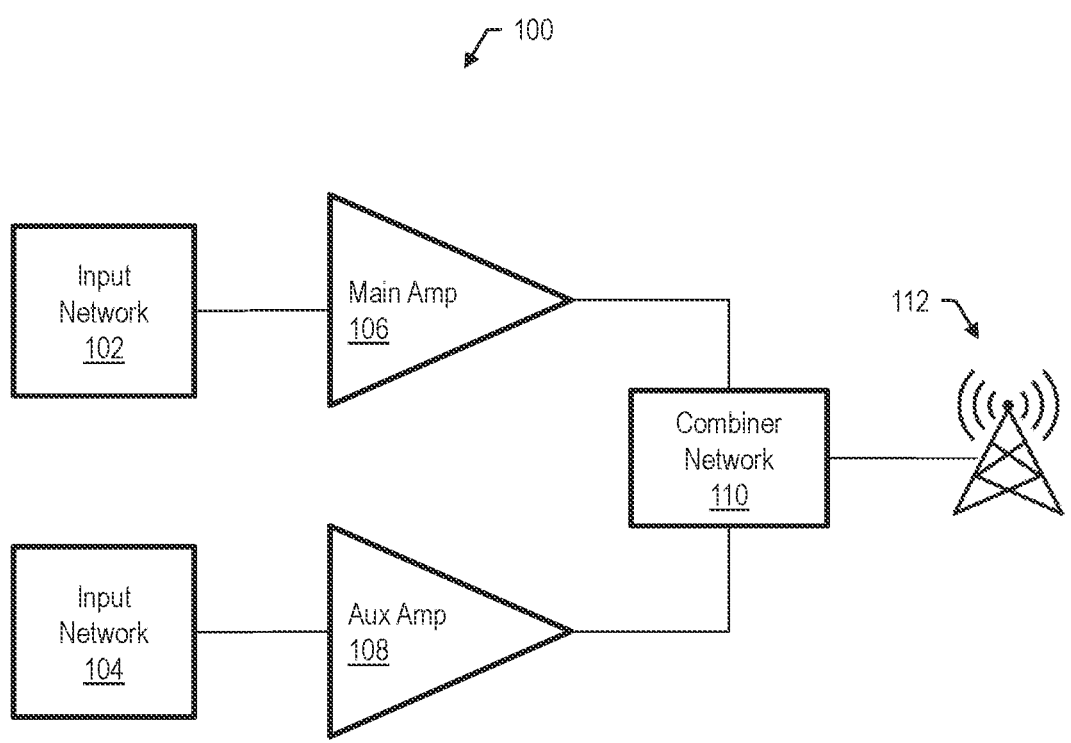
FIG. 1 is a block diagram of an example HCD amplifier.

FIG. 1 is a block diagram of an example HCD amplifier 100. The amplifier 100 includes a first input network 102 and a second input network 104, a main amplifier 106 coupled to a first output of the first input network 102, an auxiliary amplifier 108 coupled to a second output of the second input network 104, and a combiner network 110. The combiner network 110 is coupled to an output of the main amplifier 106 and an output of the auxiliary amplifier 108. The combiner network 110 includes an output node for coupling to a load, e.g., an antenna of a base station 112 for a radio network.

In operation, the HCD amplifier 100 receives a radio frequency (RF) signal at the input to the input networks 102 and 104. The combiner network 110 receives the output signals from the main amplifier 106 and the auxiliary amplifier 108. The combiner network 110 outputs an amplified signal to the load.

The HCD amplifier 100 includes a push-pull configuration of the main amplifier 106 and the auxiliary amplifier 108. The main amplifier 106 is implemented using an inverse class F mode of operation for increased output power capability and reduced output matching circuit requirements. The auxiliary amplifier 108 can be implemented using a class C mode of operation.

The reduced output matching circuit requirements allows a user to fully take advantage of the increased power capability of the push-pull configuration, while reducing the amount of components needed to keep the solution cost efficient. The HCD amplifier 100 is scalable, and its power back-off (PBO) efficiency feature can be implemented for a wide array of power requirements.

In some examples, simulations of the HCD amplifier 100 demonstrated a total output power of 45.5 dBm with a drain efficiency of 75% over a power back-off range of 3 dB (8 dB capable, i.e., theoretically ideal). This 1.75× increase in output power compared to some conventional systems is achieved by configuring each amplifier branch in the dual-input outphasing power amplifier topology as a push-pull transistor pair. Furthermore, the HCD amplifier's complexity and increased component requirements are reduced by implementing the main amplifier 106 as inverse class F. Over the 3 dB power back-off range, the drain efficiency is also observed to remain approx. 10% flatter, compared with some conventional systems.

Figure 2:
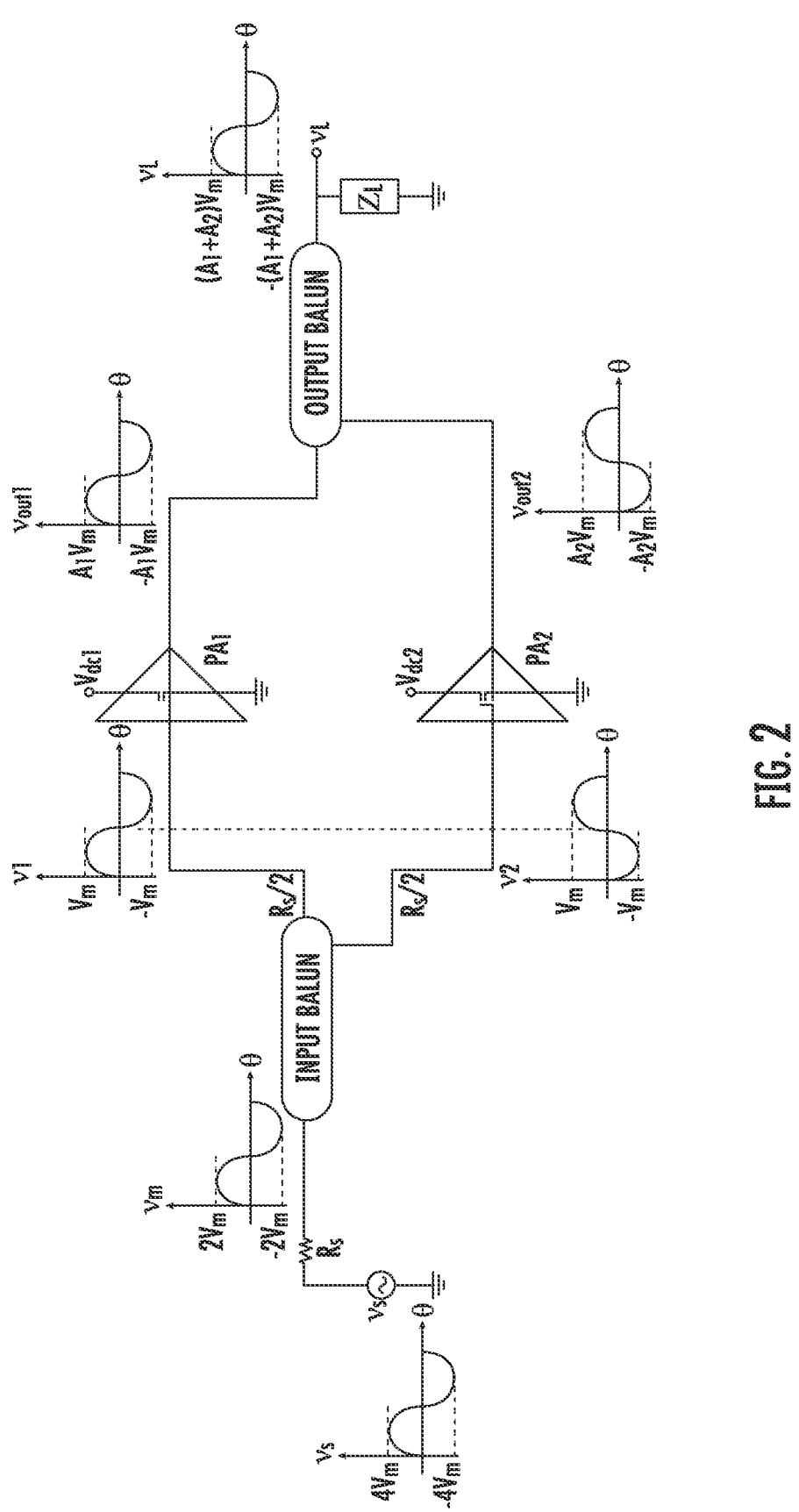
FIG. 2 is a circuit diagram illustrating an example push-pull configuration.

FIG. 2 is a circuit diagram illustrating an example push-pull configuration. The push-pull configuration was originally developed as an alternative to class B operation, to reduce the amount of distortion. This was critical for audio applications that had to preserve complex signals and is also useful for its ability to effectively double the output power of an amplifier.

The input signal is split at the balun into two equal components with opposite phase. The two signals are amplified by their respective amplifier's gain, A, and combined at the output balun. The end result is that the output signal at the load is effectively doubled.

It also has the advantage of impedance doubling, which should help with the input matching networks (MNs) near-zero impedance values. The main drawback is that it may require two transistors and two baluns to split and combine the signal at the gates and drains respectively. It may also increase the design's complexity. The push-pull connections do not change the operating class requirements for each branch of the HCD topology. In other words, each stage of the push-pull configuration will still need to be designed to meet its operating class's criteria and harmonic termination networks requirements.

Furthermore, configuring the main and auxiliary amplifiers as push-pull will not affect the overall HCD operation, or change its requirements. The bias values at peak and back-off will be applied equally to each transistor in the push-pull pair. The peak to back-off voltage ratio for the auxiliary amplifier is still the required value of unity.

The push-pull configuration also presents an opportunity to optimize the design of the main amplifier by implementing an inverse class F operating class instead of class F. The push-pull configuration will cancel out the even harmonic frequencies by design since it is the common mode signal. The harmonic termination requirements for inverse class F operation are conveniently to present a high impedance to even harmonics, and low impedance to odd harmonics. By leveraging this theory, the output MN requirements will be simplified for the main amplifier design by only requiring handling of the odd harmonic.

Push-Pull Inverse Class F Amplifier Design

A standalone inverse class F amplifier using push-pull topology can be developed as the first step in designing the power enhanced HCD's main branch. The process can start with a single-ended design so that simulation and optimization using advanced design system (ADS) is quicker and the overall circuit is much more manageable. Scaling the single-ended design to a push-pull configuration may require less effort, as it may enable re-use of the MNs already designed with a little optimization.

The operation of inverse class F follows a similar theoretical concept of the class F, with a few differences to note. The harmonic termination requirements are reversed; requiring all odd harmonics to be shorted and even harmonics to have high impedance terminations. This will result in inverse class F operation generating larger voltage swings, approximately $\sqrt{2}$ larger, driving the amplifier deeper into saturation. It follows that the load requirement will need to be $\sqrt{2} \times R_L$.

$$Z_{f_0} = R(\text{optimal load})$$

$$Z_{2nf_0} = \infty$$

$$Z_{(2n+1)f_0} = 0$$

A single-ended test bench was set up. An ideal triplexer is implemented using an S2P equation element presenting the ideal harmonic terminations for the inverse class F mode of operation: open circuit for even harmonics and short circuit for odd harmonics. The S2P equation element in ADS implements the following logic for the simulation:

S11=0 at the fundamental freq.
S11=1 at the $2^{nd}$ harmonic freq.
S11=−1 at the $3^{rd}$ harmonic freq.
S21=1 at the fundamental freq.
S21=0 at all other freq.

A perfect match at the fundamental frequency is defined at this stage. The drain and gate voltages together with the load resistance are configured as tunable values, used to dial in the desired inverse class F performance.

Figure 3:
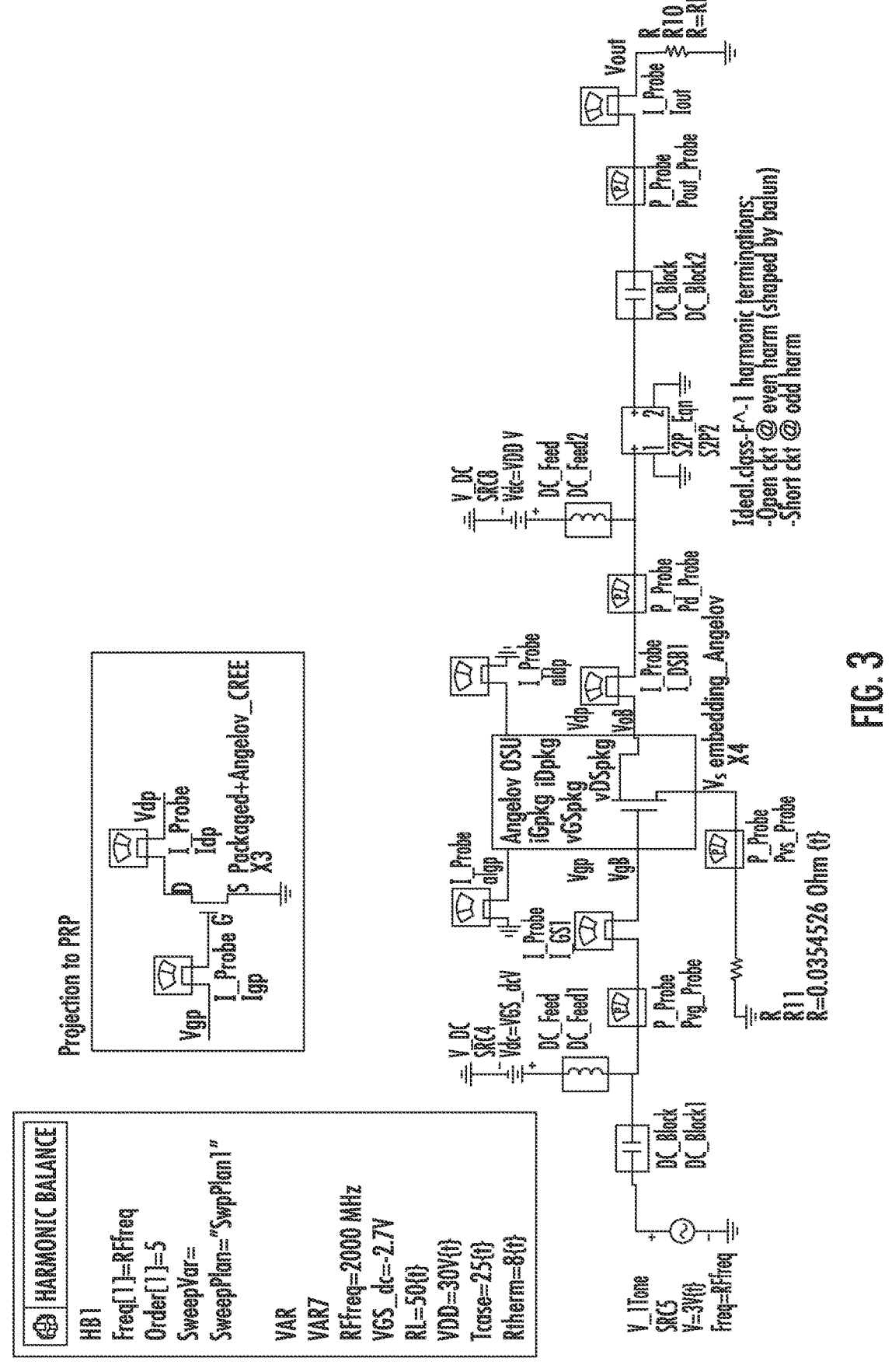
FIG. 3 is a test bench schematic illustrating an example circuit diagram for the single ended inverse class F amplifier design.

FIG. 3 is a test bench schematic illustrating an example circuit diagram for the single ended inverse class F amplifier design. The final tunable values, noted in the test bench schematic, yield a drain efficiency of 77.6% at a peak output power of 14.2 W once projected to the package reference plane (PRP). Projecting to the PRP can include embedding the networks needed to simulate the effects of the device's package and extrinsic parasitic signals and/or losses. The drain voltage and current waveforms confirm the inverse class F mode of operation. The projected impedance values are used for the design of the input and output MNs.

The MNs are distributed and implemented using ideal transmission line sections. Shunt open circuit stubs are used for the output network to help match the harmonic frequencies to their projected values. Realistic ranges are set for the impedance value of each section to ensure the final result is feasible for implementation. Each design procedure involves setting up the ADS optimizer with tight tolerances on the expected impedance values at each harmonic frequency (i.e. optimization goals). Initial values are set using a small-signal simulation for the standalone network, and then fine-tuned when it is implemented with the rest of the power amplifier topology. Converging on the goals may take some time, and multiple iterations may be needed to obtain the desired results.

Figure 4:
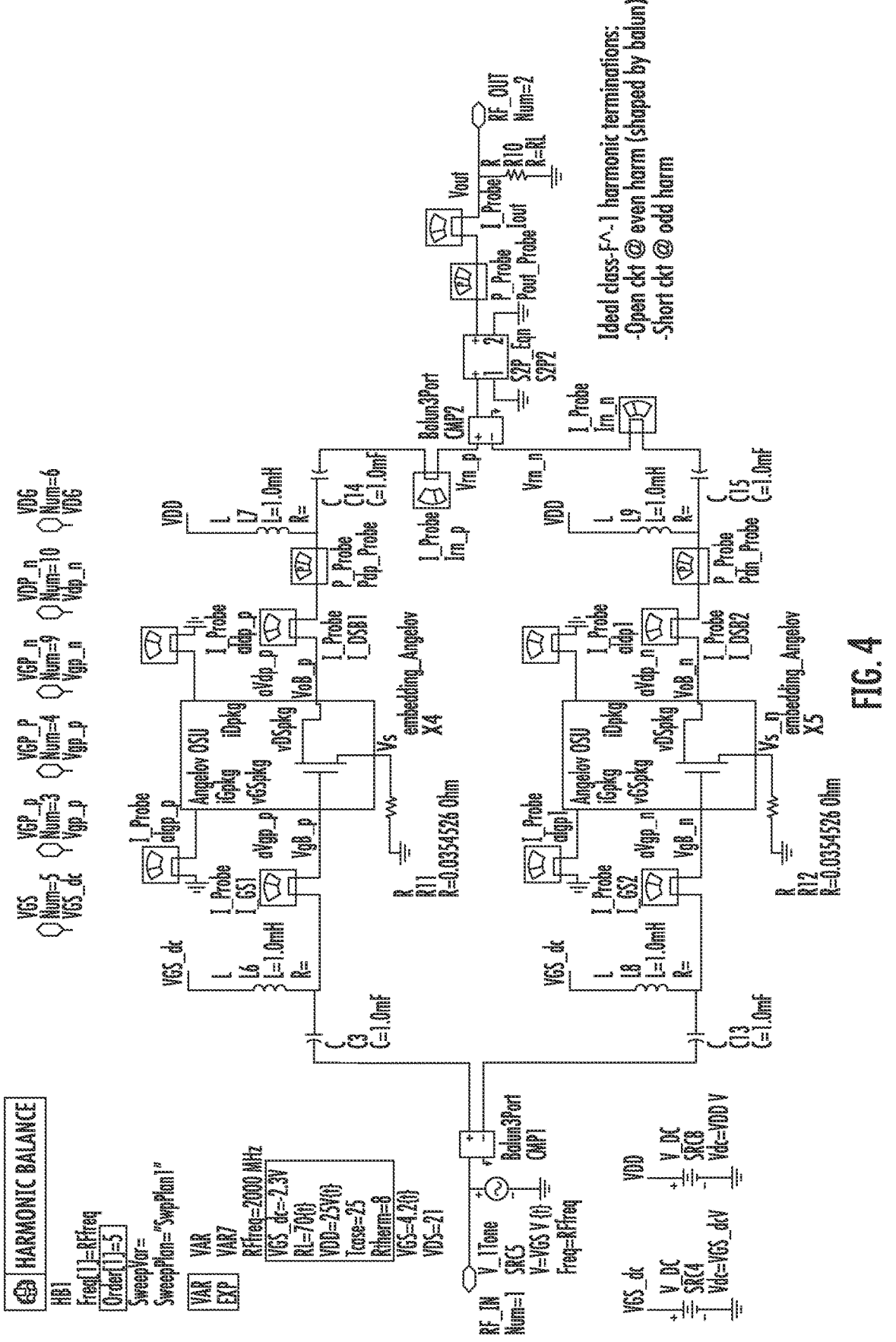
FIG. 4 shows the inverse class F amplifier designed at the current reference plane (CRP) using a push-pull configuration.

Next the test bench is converted to push-pull by adding an additional branch to the single-ended topology. FIG. 4 shows the inverse class F amplifier designed at the current reference plane (CRP) using a push-pull configuration.

The signal at the input and output are split and combined respectively using an ideal balun. The same procedure is repeated as before where the tunable values are adjusted to yield the desired inverse class F performance at the CRP and then projected to the PRP to determine the target impedance values for the MNs needed at the package level.

Slight adjustments to the gate and drain voltage may be required, but the most significant change is to the load resistance. It is expected that the ideal load is larger than it was for the single-ended design, approximately $\sqrt{2} \times RL$. The MNs can be mostly reused from the single-ended design with some accommodation for the output. The inverse class F operation can benefit from the even harmonic cancellation inherent from a push-pull configuration. As such, only a single output MN is needed after the balun to match the fundamental and odd harmonics (third harmonic only in this application). The third harmonic may contain the most power, and may be the most critical at this stage of development. It'll also significantly reduce circuit complexity and simulation time. The values of the output MN can be further refined.

The completed push-pull inverse class F design should make 29.85 W of output power with a drain efficiency of 73.5%. Compared to the single-ended version, the efficiency is degraded by 4.1%, but the output power has effectively been doubled.

The inverse class F design differs in a few ways compared with the traditional class F. The harmonic termination requirements are the inverse as it requires an open circuit at the even harmonics and a short circuit at the odd harmonics. The shapes of the I-V waveforms are also flipped; in this case it's the current waveform that resembles a square pulse and the voltage waveform is a half-sinusoid. The inverse class F will also generate a large voltage swing at its output, requiring a load that is approximately $\sqrt{2} \times RL$ larger. Any reliability concerns can be mitigated by the large drain voltage breakdown rating provided by gallium nitride (GaN) technology, e.g., by using GaN transistors.

Push-Pull Class C Power Amplifier Design

Figure 5:
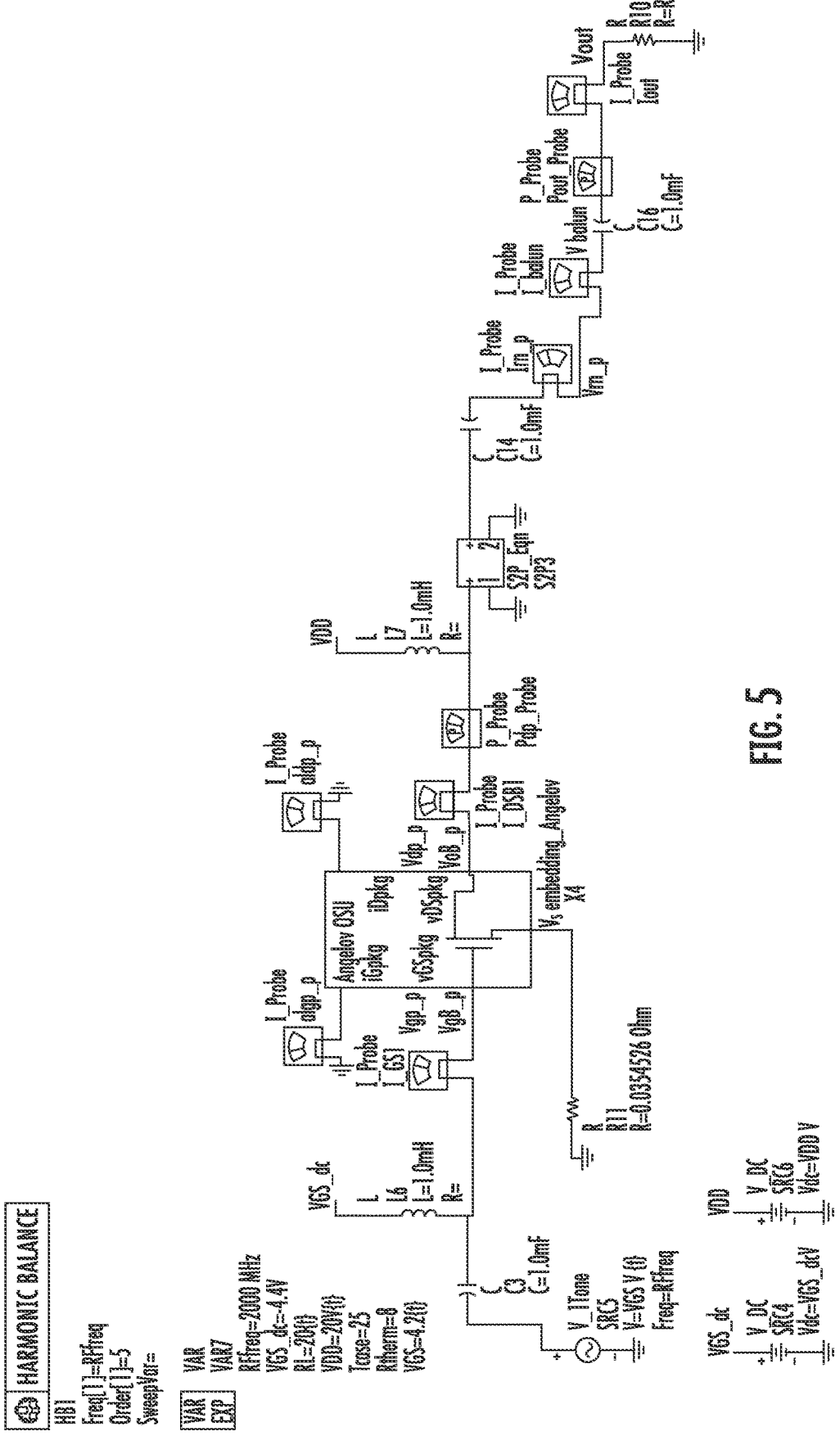
FIG. 5 shows a single-ended class C embedding model test bench.

The methodology for the class C power amplifier design mirrors that of the previously described inverse class F. FIG. 5 shows a single-ended class C embedding model test bench.

The design is started with a single-ended topology and later scaled to a push-pull configuration. The current and voltage waveforms defined at the drain differ for the class C, resembling more of a half-sinusoidal wave shape that's left ringing at the tail end. Furthermore, the harmonic terminations presented at the drain need to short all of the harmonics, in contrast to the even and odd requirements of the inverse class F. The single-ended configuration is projected to make 13.9 W of peak output power with a drain efficiency of 69.1%. The degradation from CRP to PRP simulated performance is more pronounced for the class C, with simulated CRP values of 14.6 W peak power and 74.1% drain efficiency. Better performance is possible with additional tuning, but the waveform shape of the class C mode of operation can be more difficult to engineer.

Scaling the class C amplifier embedding model test bench to push-pull follows the same procedure of the inverse class F with one exception—the output MN location. Since the requirement for class C operation is to short all harmonics at the drain, and push-pull topology by design will cancel the third harmonic (i.e. open circuit), each branch will require its own output MN prior to being combined at the balun. This will afford no circuit reduction at the implementation stage, but as will be seen later, simplifies the transition to push-pull since the same MN can be directly reused. As before, adjustments to the bias can be used to dial in the desired class C waveforms, and the ideal load resistance is found to be larger than the single-ended value.

Figure 6:
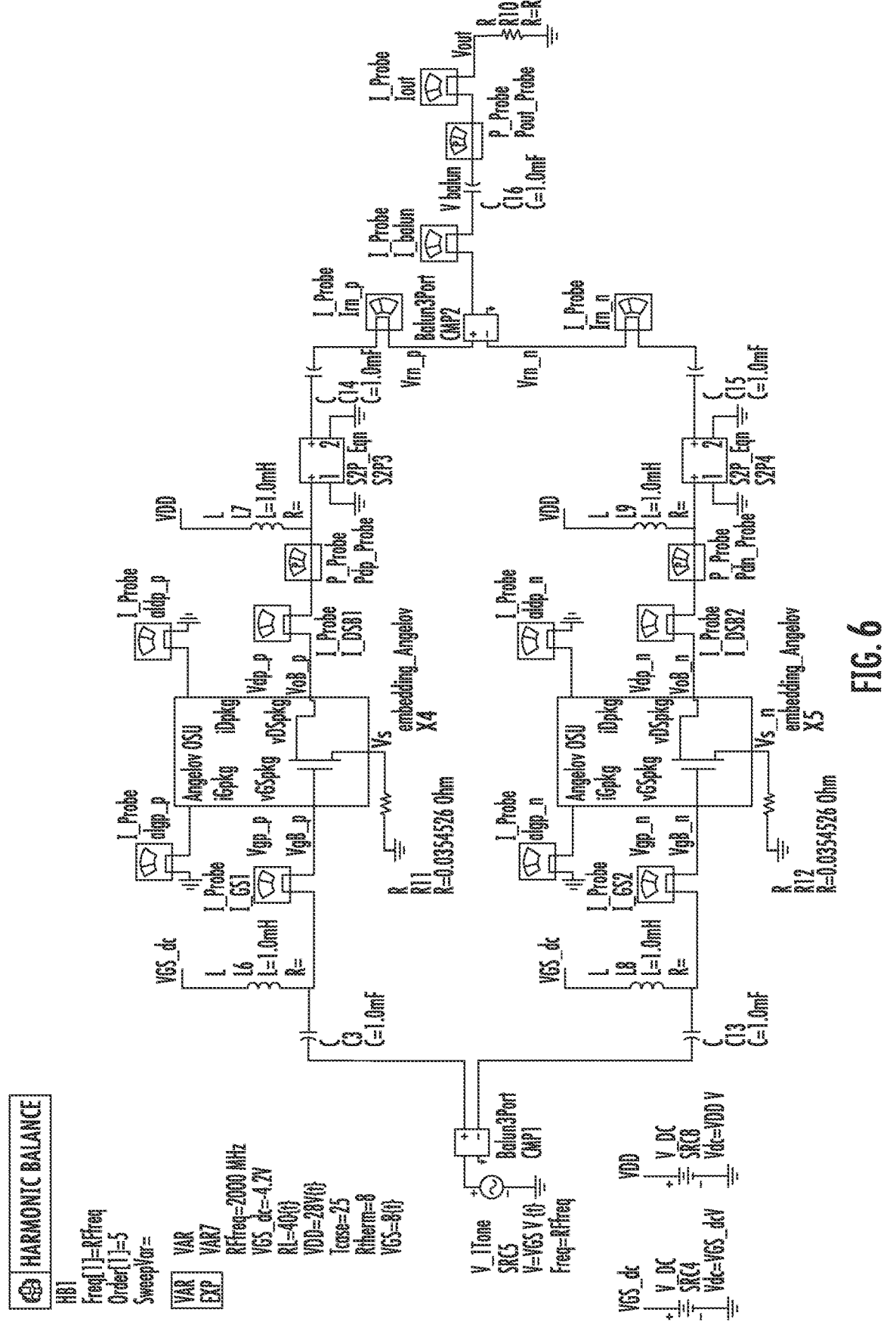
FIG. 6 shows a push-pull class C embedding model test bench.

FIG. 6 shows a push-pull class C embedding model test bench. The push-pull configuration of the class C amplifier provides a peak output power of 29.8 W with a drain efficiency of 73.6%. However, much like the single-ended design, the projected performance at the PRP is slightly degraded with only 68.5% drain efficiency but still achieves 28.5 W of peak power. The bias values derived for the standalone class C amplifier will differ when implemented as the auxiliary amplifier in the overall HCD topology.

Main Power Amplifier—Inverse Class F Mode of Operation

Figure 7:
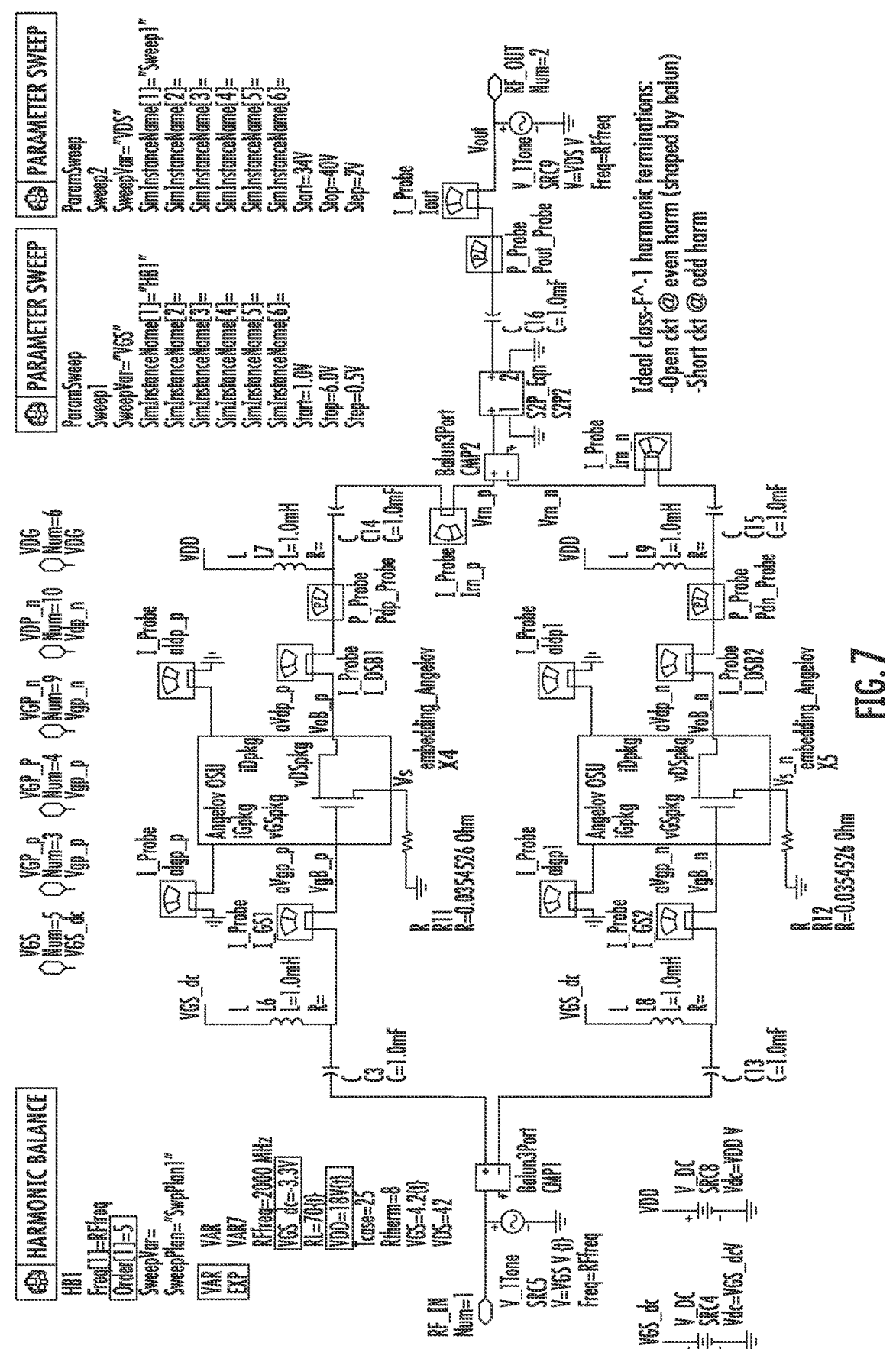
FIG. 7 shows a main amplifier test bench with final bias values.

The single-ended design values simulated above do not translate to the push-pull configuration; however, the same methodology can be applied. The main amplifier operates in inverse class F and is implemented as described above. FIG. 7 shows a main amplifier test bench with final bias values.

The bias sweeps to determine the optimal VGS and VDS values are adjusted to be two times larger in magnitude. This accounts for the signals being equally split at the balun, and allow for each transistor to receive the same bias as it would in the single-ended design (and thus double the total output power). The trends observed mirror those in the single-ended design, and a 10 dB power back-off (PBO) range is achieved with reasonable bias values. As expected the gate and drain voltage values are very similar to those previously obtained, but the total voltage swing at the output is doubled.

The input RF signal, VGS (gate-to-source), and total output voltage, VDS (drain-to-source), are swept using a nested parameter sweep simulation. Each transistor in the push-pull configuration is biased equally (top and bottom transistors are the positive and negative swings of the input signal respectively). The ideal harmonic termination is implemented as ideal triplexer logic and accounts for shorting the odd harmonic frequencies. An ideal balun is used at the input and output to split and combine the RF signal respectively.

Auxiliary Power Amplifier—Class C Mode of Operation

Figure 8:
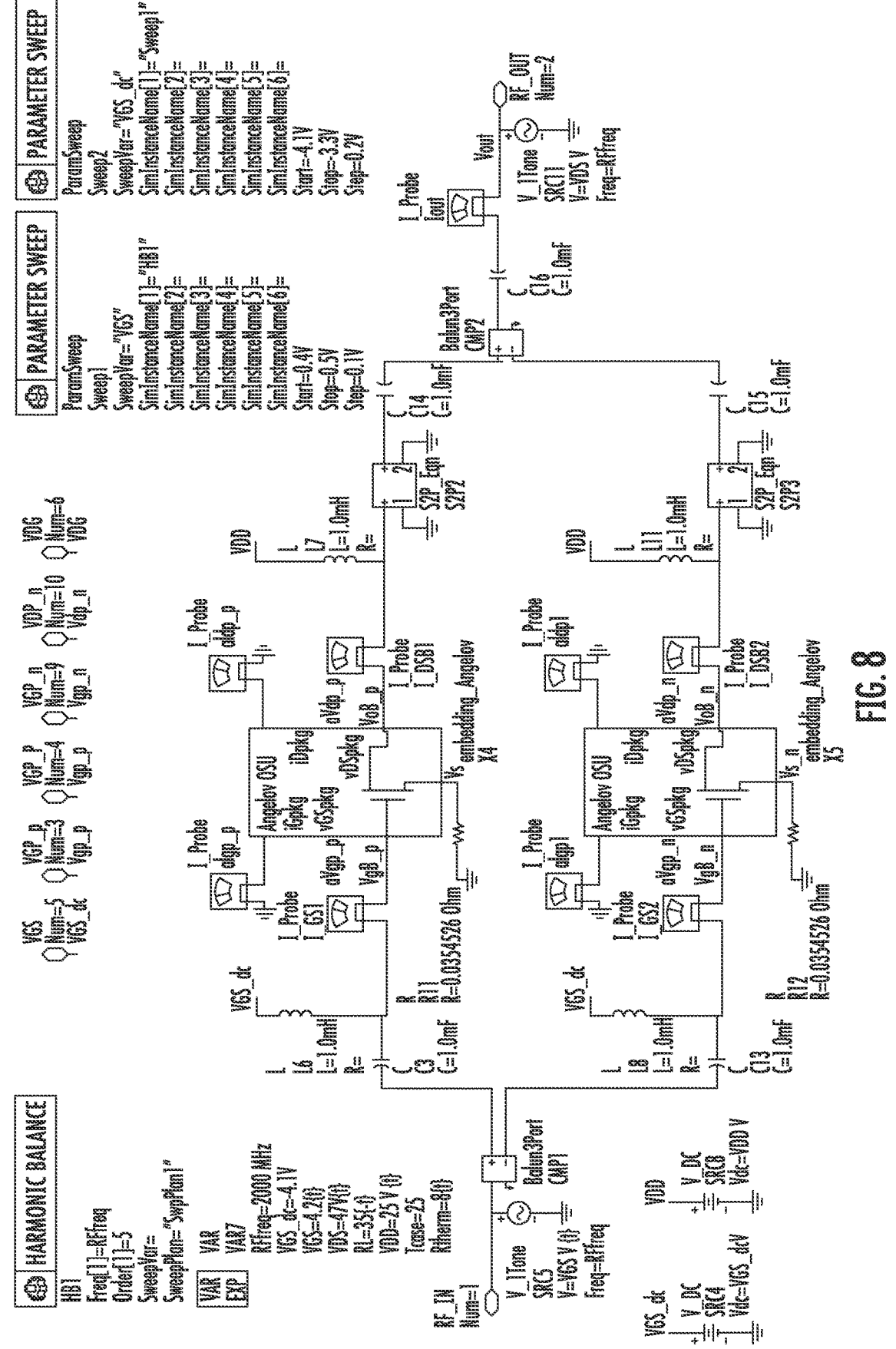
FIG. 8 shows an auxiliary amplifier test bench with final bias values.

FIG. 8 shows an auxiliary amplifier test bench with final bias values. The topology of the class C auxiliary test bench resembles the inverse class F with the exception of the output MNs. Class C operation requires all harmonic frequencies to be shorted and as such, cannot make use of the even harmonic cancellation provided by the push-pull setup. Therefore each branch transistor has its own harmonic termination network at the output.

In addition to maximizing power output and efficiency, the bias values are selected to align the PBO range with the main amplifier. The limited VGS range (1.1V to 2.5V) differs from that of the main amplifier (1.0V to 5.5V) suggesting the amplifier may saturate too quickly. The auxiliary amplifier should have a delayed power-on to "peak" when the main amplifier goes into saturation.

Push-Pull Hybrid Chireix-Doherty Simulation

Figure 9:
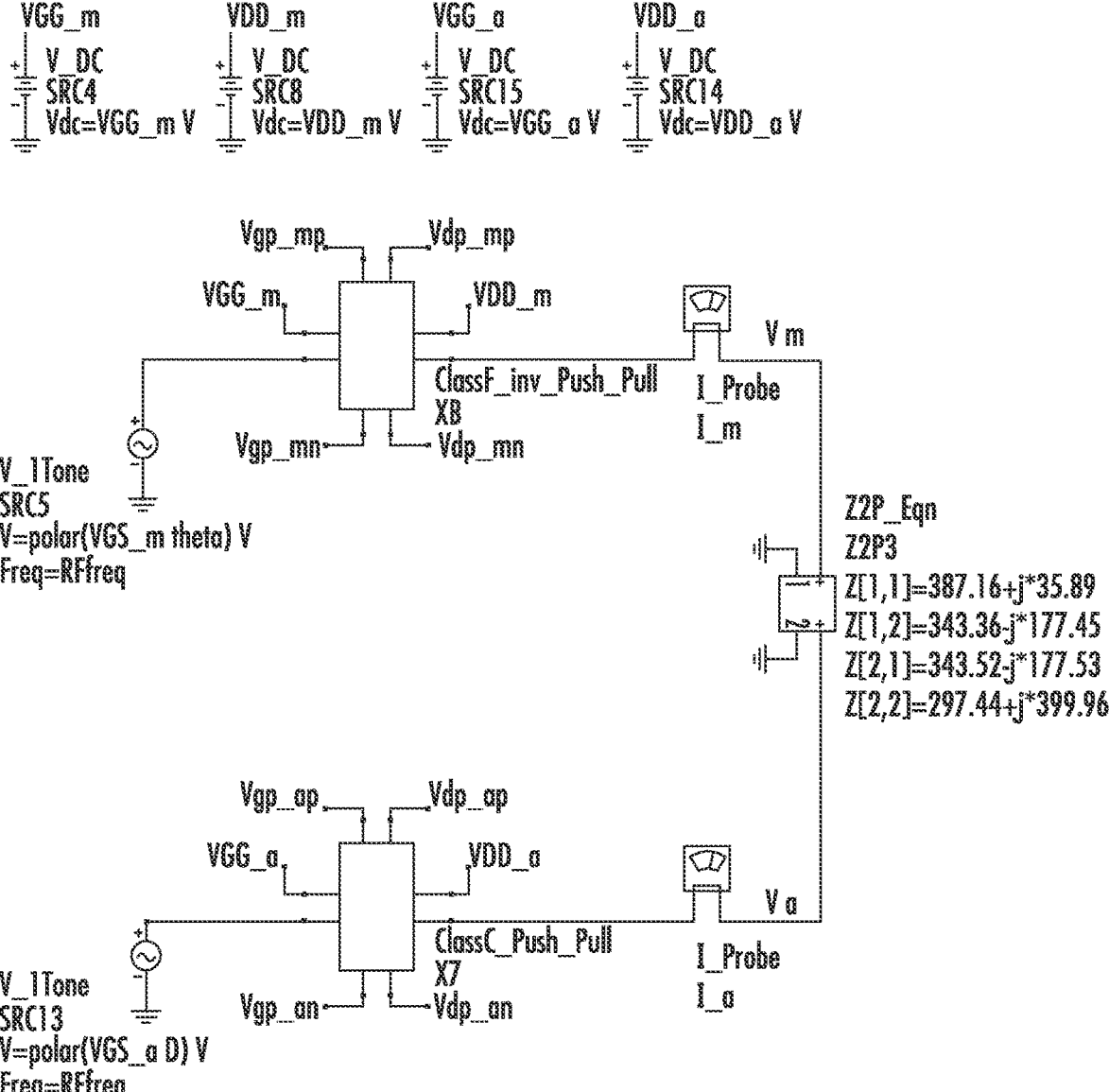
FIG. 9 shows an embedding model HCD test bench updated with the push-pull configured branches.

FIG. 9 shows an embedding model HCD test bench updated with the push-pull configured branches. The embedding model HCD test bench at the CRP is updated with the latest push-pull main and auxiliary designs. The input VGS for each branch is swept vs. the outphase angle using the same data access component (DAC) setup from the single-ended design. The bias values simulated from the main and auxiliary amplifier sweeps are used to generate the Z-parameters for the intrinsic combiner. These are calculated using the same relationships established in the single-ended design, e.g., using a MATLAB script. The look-up table (LUT) for the DAC is also updated to reflect the new peak and backoff conditions.

The LUT for the auxiliary amplifier's VGs can be modified to more closely align with the main amplifier's range. The LUT from the final single-ended design is leveraged to accommodate the push-pull configuration. This improves the performance of the push-pull HCD at the CRP and corrects the "peaking" behavior of the auxiliary amplifier. Further optimization of the remaining bias values can be carried out in a systematic manner, taking note of how each parameter affects the overall performance of the HCD design. An 8 dB PBO range sustaining 80% drain efficiency is achieved with a max output power of 45.6 dBm. The outphase angle range for the PBO region occurs from 54° to 144°, only a few degrees narrower than with the single-ended design.

The simulated output load reflection coefficients at the CRP are well aligned to the expected trends established in the single-ended design. The main amplifier's load trajectory is slightly reduced compared with the auxiliary. The harmonic terminations at the CRP are ideal. The use of the push-pull configuration and utilizing an inverse class F main amplifier helped double the output power with minimal impact to the PBO range and sustained efficiency compared to some conventional systems.

| Final Design Parameters for the Push-Pull HCD at the CRP. Design Parameters for the Push-Pull HCD PA @CRP | | | | | | |
|---|---|---|---|---|---|---|
| \|Vm\| | \|Imp\| | \|Imb\| | \|VGS, mp\| | \|VGS, mb\| | VGGm | VDDm |
| 46 | 0.737 | 0.113 | 8.19 | 1.88 | −2.5 | 18 |
| \|Va\| | \|Iap\| | \|Iab\| | \|VGS, ap\| | \|VGS, ab\| | VGGa | VDDa |
| 47 | 0.623 | 0.012 | 8.02 | 2.32 | −3.9 | 26 |

-continued

| Final Design Parameters for the Push-Pull HCD at the CRP. Design Parameters for the Push-Pull HCD PA @CRP | | | | | | |
|---|---|---|---|---|---|---|
| m | n | ϑ, b | ϑ, p | PBPR | Tcase | Rtherm |
| 0.112 | 0.863 | 33° | 147° | 8.2 dB | 25 | 8 |

*Units in Volts, Amps, and Ohms

The embedding model approach enables tuning the intrinsic performance to meet the application criteria and project the voltage and currents values to the PRP. These projected values confirm the performance at CRP using the device package model and can used to design the matching and combiner circuits to complete the power enhanced HCD topology power amplifier.

Projection to the PRP Simulations

Figure 10:
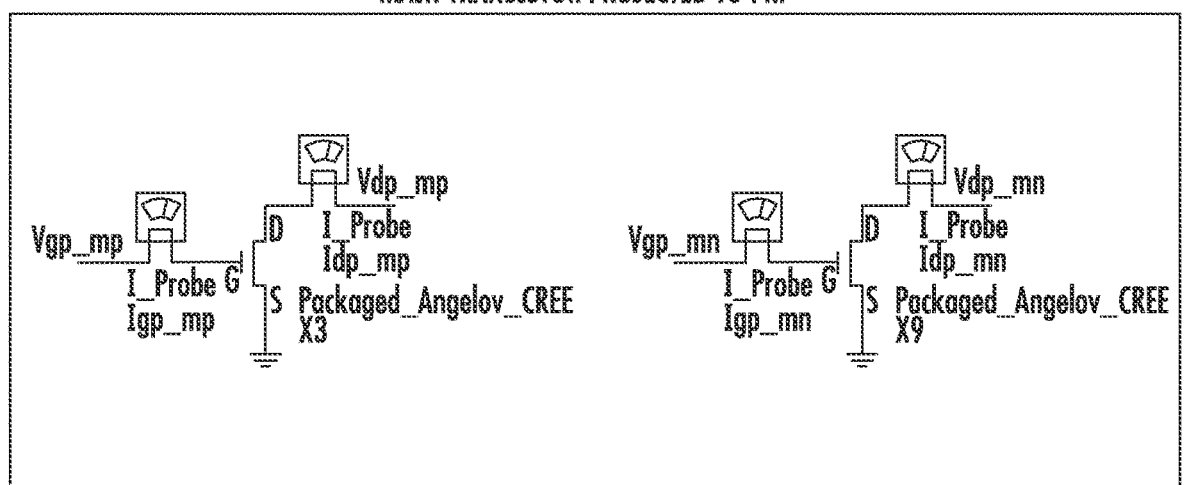
FIG. 10 shows package models used to simulate the embedded model projections.
Figure 10:
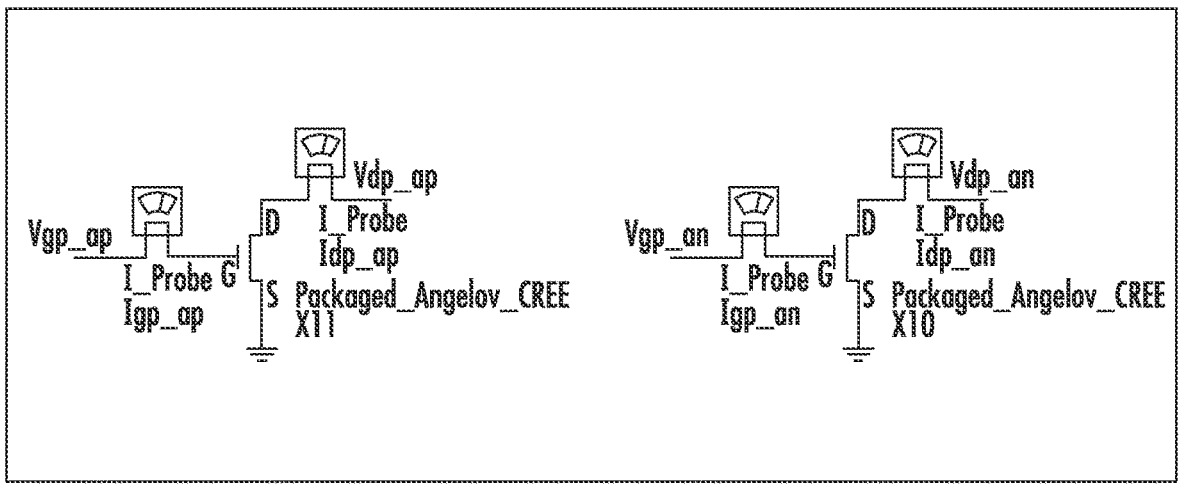

FIG. 10 shows package models used to simulate the embedded model projections. The embedding model projects the necessary voltage and current values to the PRP of each transistor's gate and drain terminals. These signals are routed to the device package models, which are inserted into the existing HCD push-pull test bench for simulation.

With the package models in place, the HCD simulations are re-run to generate the I-V waveforms and reflection coefficients at the PRP. The simulation results are plotted for each individual transistor in the push-pull configuration, for both main and auxiliary amplifier branches. It was verified that the performance for each transistor push-pull pair is identical, as expected. The trends observed are similar to those observed in the single-ended design. For the load reflection coefficients, the same 90° counter-clockwise rotation is present. The input impedance is once again very close to a short. The harmonic reflection coefficients have been normalized.

Input Matching Network Design

Figure 11:
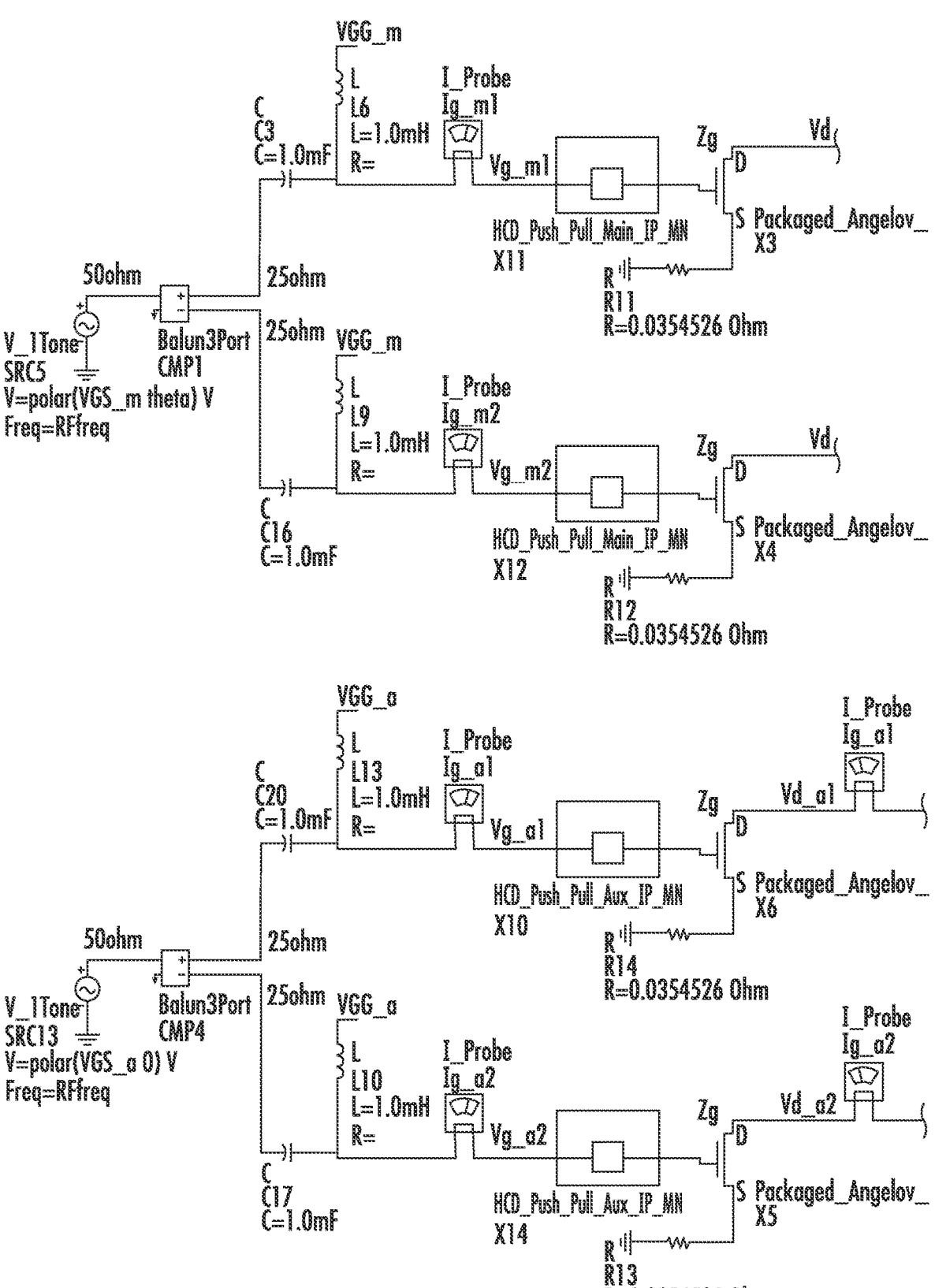
FIG. 11 shows a test bench highlighting the input MN location and impedance requirements.

FIG. 11 shows a test bench highlighting the input MN location and impedance requirements. The gate of each transistor can be matched to the source. The push-pull configuration adds an ideal balun at the input to equally split the source signal, so instead of matching the simulated gate impedance to 50Ω, it is matched to 25Ω.

From projected input impedance simulations, the median values (1.169+j3.23Ω for the main transistors and 0.15+j2.775Ω for the auxiliary transistors) corresponding to an outphase angle of 90° are selected for the MN design. A simple three element, pi-network topology using lumped components is used. The values can be determined manually using a Smith chart and further optimized in ADS.

Figure 12:
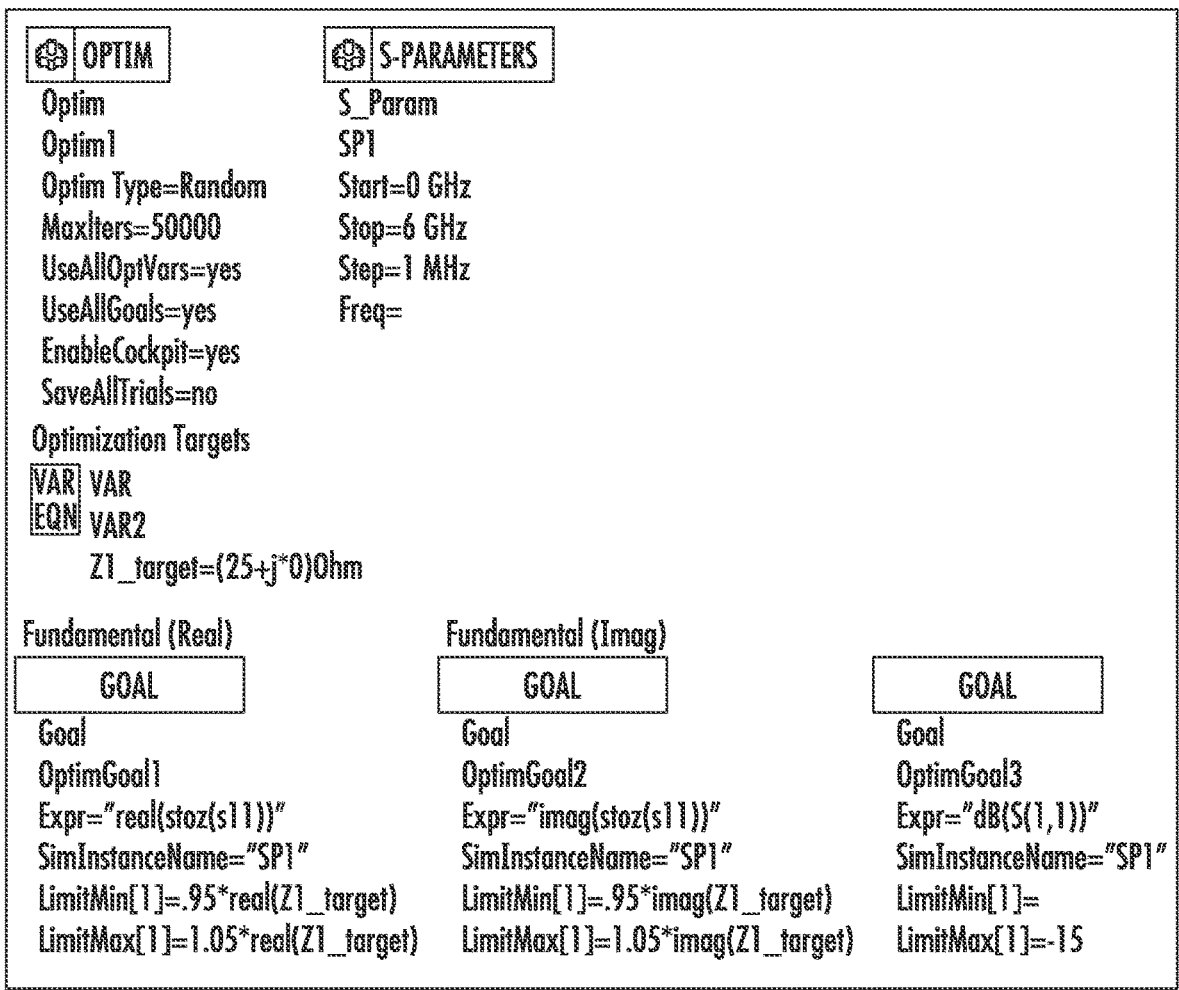
FIG. 12 shows the main input MN optimization using ADS goals and provides the final values for the main transistors' input MN.
Figure 12:
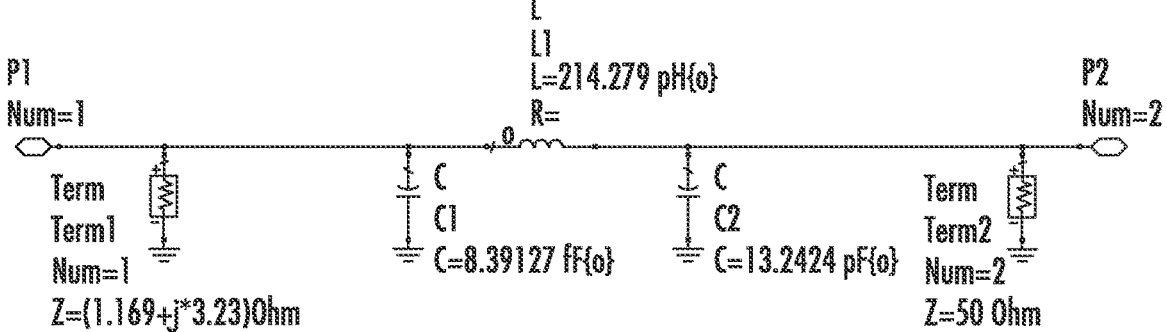

FIG. 12 shows the main input MN optimization using ADS goals and provides the final values for the main transistors' input MN. The return and insertion loss values at the fundamental frequency are reasonable, and all harmonic frequencies are rejected. At the fundamental frequency, the impedance is close to the targeted 25Ω. The final values for the MN components are very small, falling into the fF and pH range. The final values could also be implemented as a higher order, distributed circuit.

Figure 13:
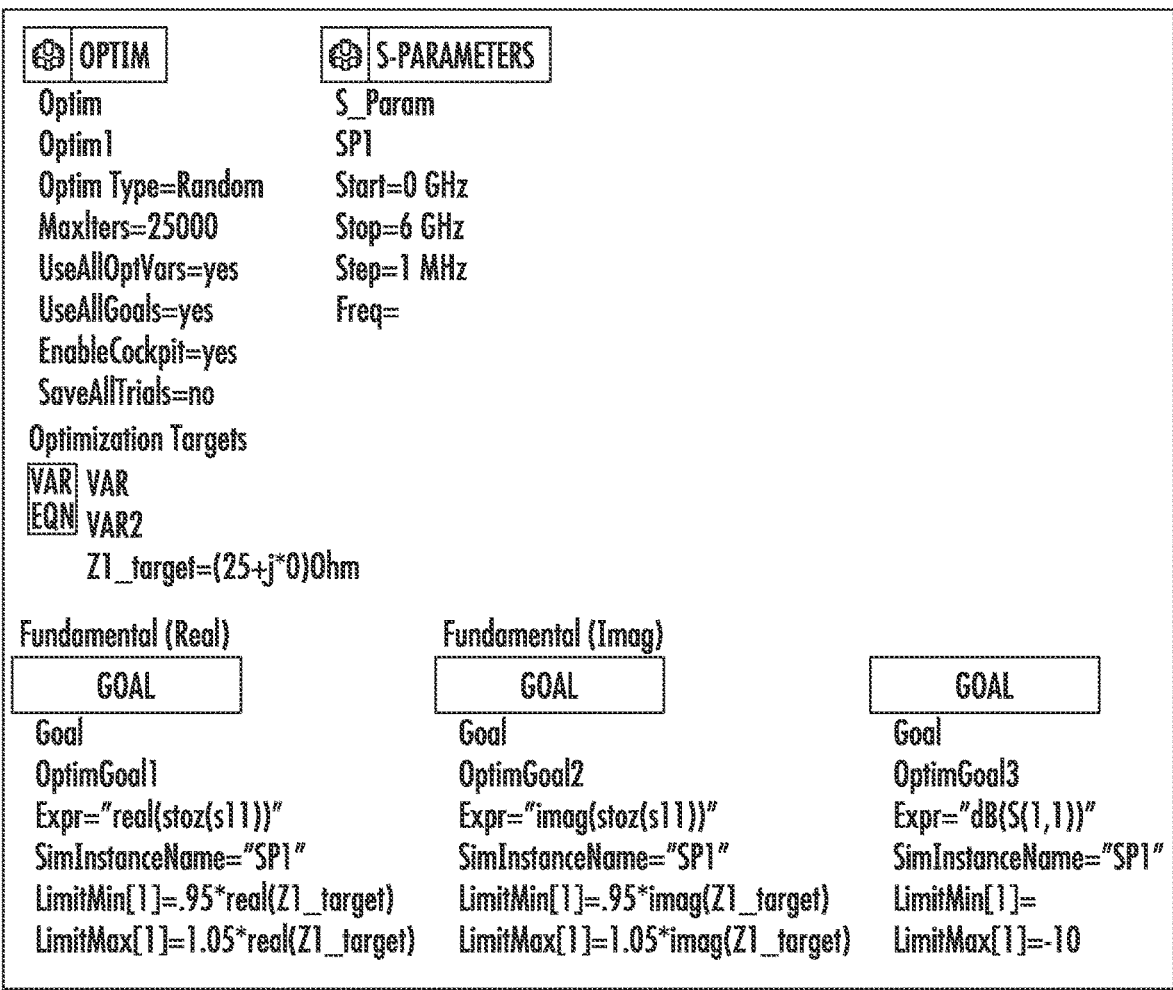
FIG. 13 shows the auxiliary input MN optimization using ADS goals.
Figure 13:
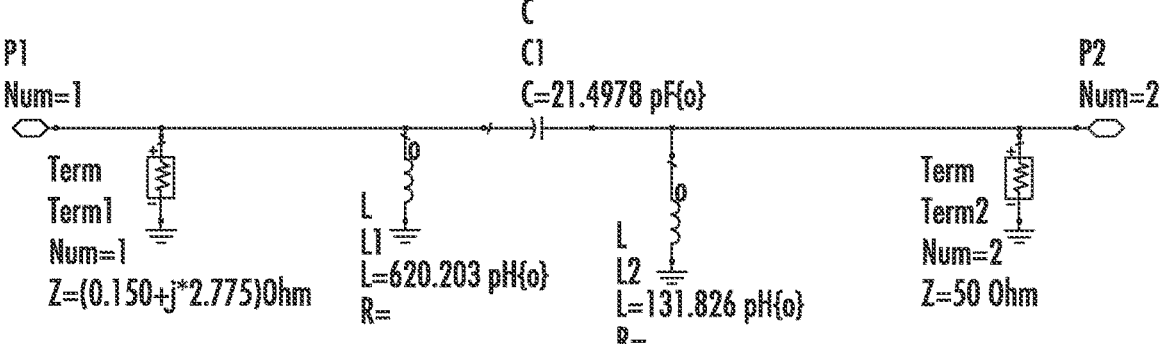

The same procedure is repeated for the auxiliary input MN circuits. The results are similar for the final values of its MN components. FIG. 13 shows the auxiliary input MN optimization using ADS goals.

Output Matching Network Design

Figure 14:
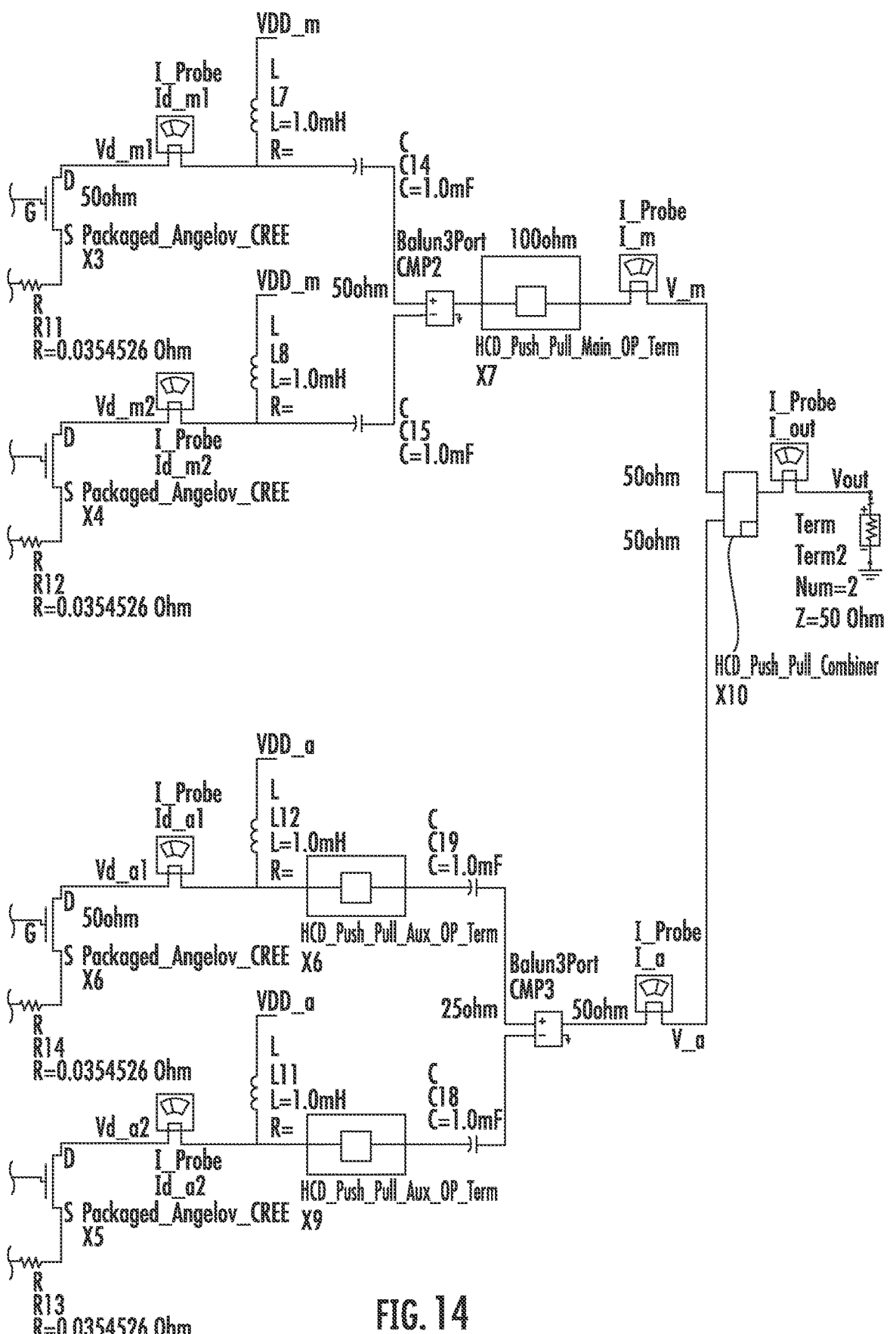
FIG. 14 illustrates output matching network impedance targets.

FIG. 14 illustrates output matching network impedance targets. The goal for the output MN is to match the projected harmonic impedance values while at the same time allowing the fundamental frequency to pass with minimal loss. The topology adopted at this stage is ideal transmission lines with an open circuit stub that's a quarter-wavelength long at the harmonic frequency of interest. The location of the MN will differ for both main and auxiliary branches. For the main amplifier, the push-pull configuration will inherently cancel out the even harmonic, so the MN should be located after the balun. For the auxiliary amplifier, a MN should be placed at the drain of each transistor. Care should be taken to correctly match the impedance pre and post-balun so that both branches are 50Ω at the combiner's input, as illustrated in FIG. 14.

The projected harmonic impedance values needed for both main and auxiliary output MN can be simulated. The values are multiplied by two to account for the signals being combined at the balun, so that it's the total impedance value that's seen by the combiner.

Main PA MN target impedance values at even and odd harmonic frequencies:

$$2fo=(0+j*9.373)\text{ohm@drain}\times2(\text{MNpost balun})=(0+j*18.746)\text{ohm}$$

$$3fo=(0-j*50.049)\text{ohm@drain}\times2=(0-j*100.098)\text{ohm}$$

Auxiliary PA MN target impedance values at even and odd harmonic frequencies:

$$2fo=(0-j*23.687)\text{ohm@drain}\times2=(0-j*47.374)\text{ohm}$$

$$3fo=(0-j*48.823)\text{ohm@drain}\times2=(0-j*97.646)\text{ohm}$$

The MN circuits for both main and auxiliary amplifiers are setup in ADS and optimization goals are configured to meet the desired impedance values at the fundamental, second harmonic, and third harmonic frequencies. Strict limits are set for the min and max impedance, as well as electrical length values of each section of ideal transmission line, to ensure the converging values determined by the ADS optimization algorithm are feasible to physically implement. The convergence of each amplifier can be accomplished by optimization.

Figure 15B:
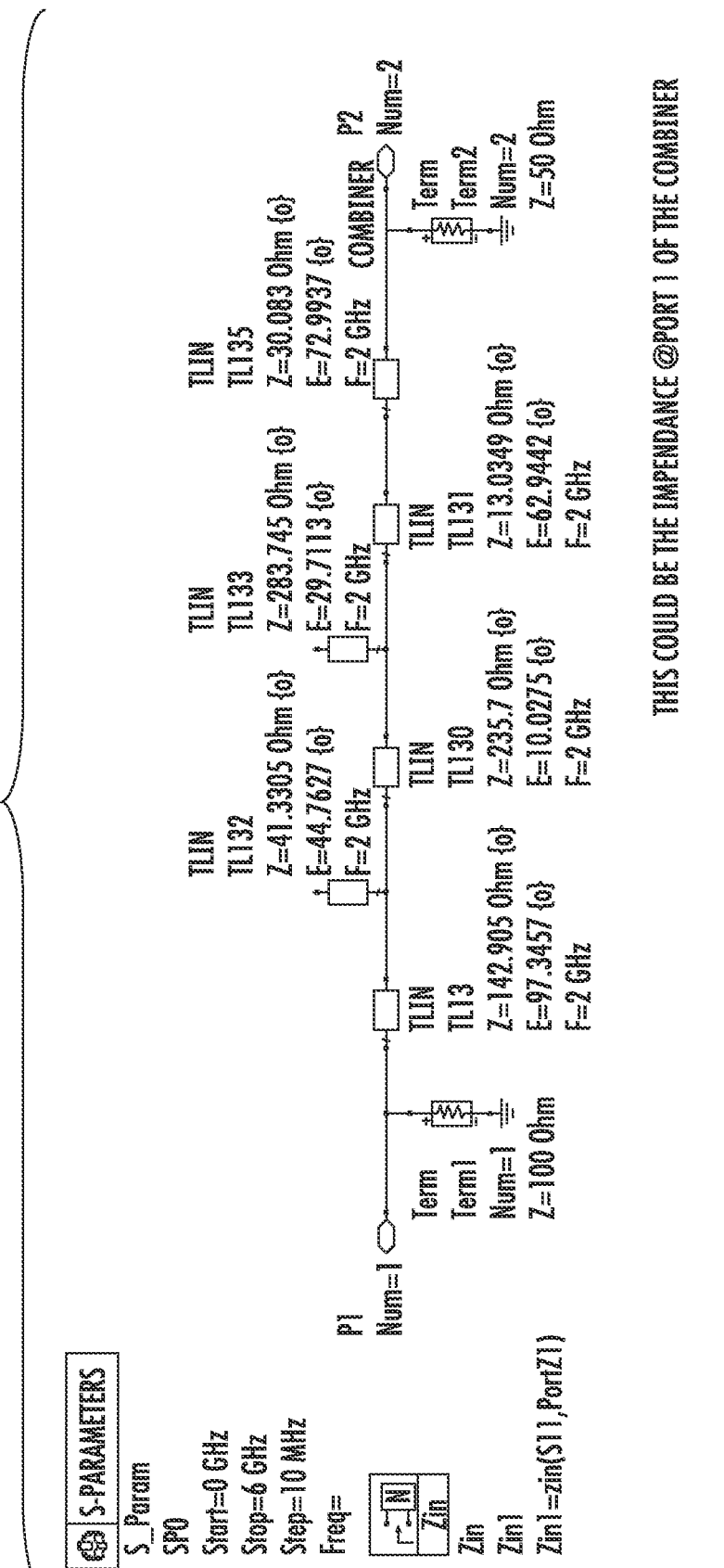

FIGS. 15A-15B show optimization test bench and final values for the main output matching network. The main amplifier's output MN theoretically requires a 100Ω to 50Ω transformation at the fundamental frequency in addition to matching the projected harmonic frequencies.

The auxiliary amplifier requires an output MN at the drain of each transistor in its push-pull configuration. The MN will transform the impedance at the fundamental frequency from 50Ω to 25Ω at the balun input. This will accomplish a combined 50Ω impedance post-balun and at the input of the combiner to align with the main amplifier. This is in addition to the matching requirements at each harmonic frequency stated earlier.

Figure 16B:
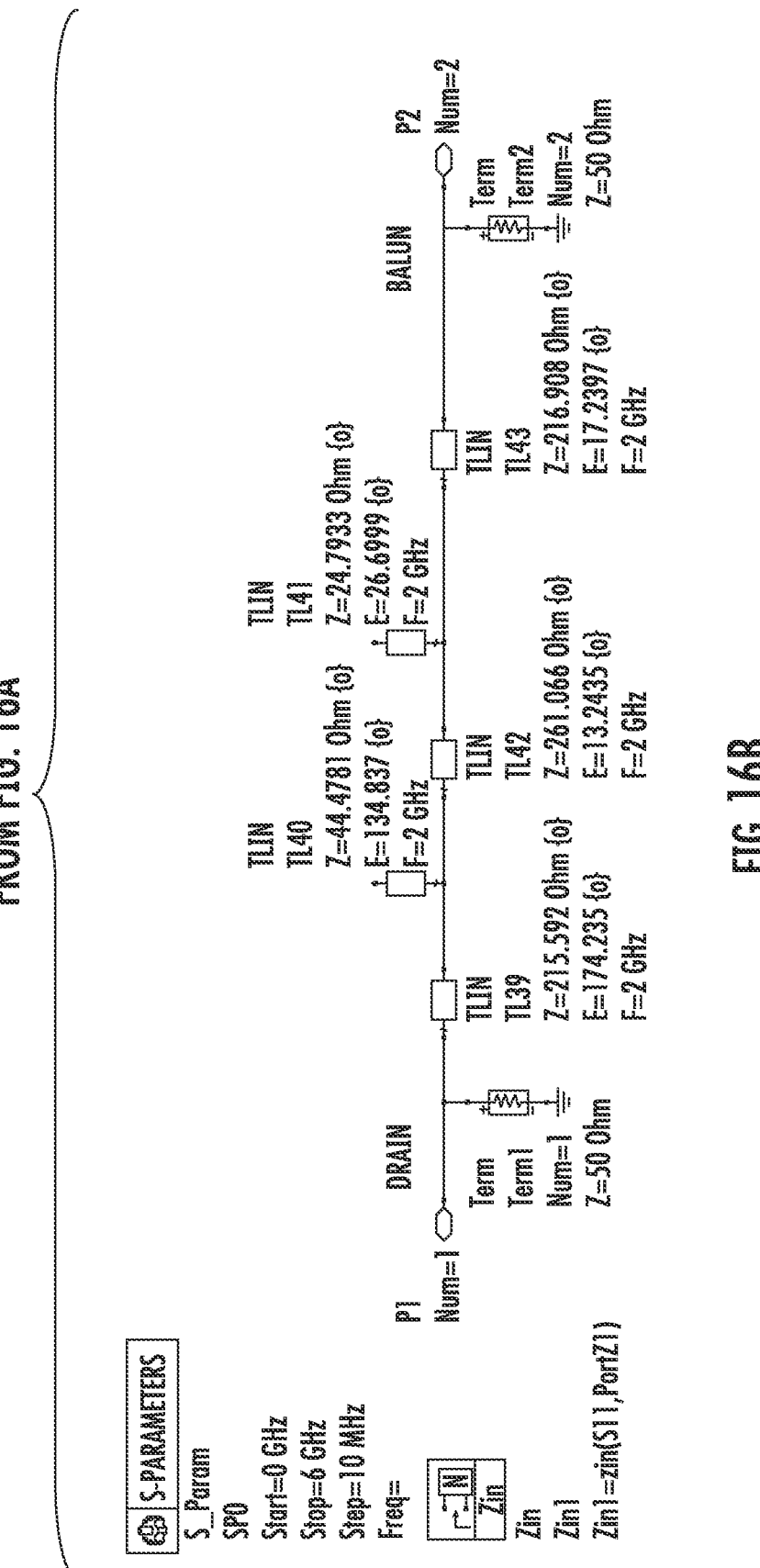

The amount of transmission line segments needed for all impedance target goals to converge differs from the main amplifier's MN, but the results are similar. Once again the return and insertion loss at the fundamental frequency are good, and the simulated impedance values are within the margin of tolerance. FIGS. 16A-16B show the optimization test bench and final values for the auxiliary output matching network.

Combiner Design

Figure 17:
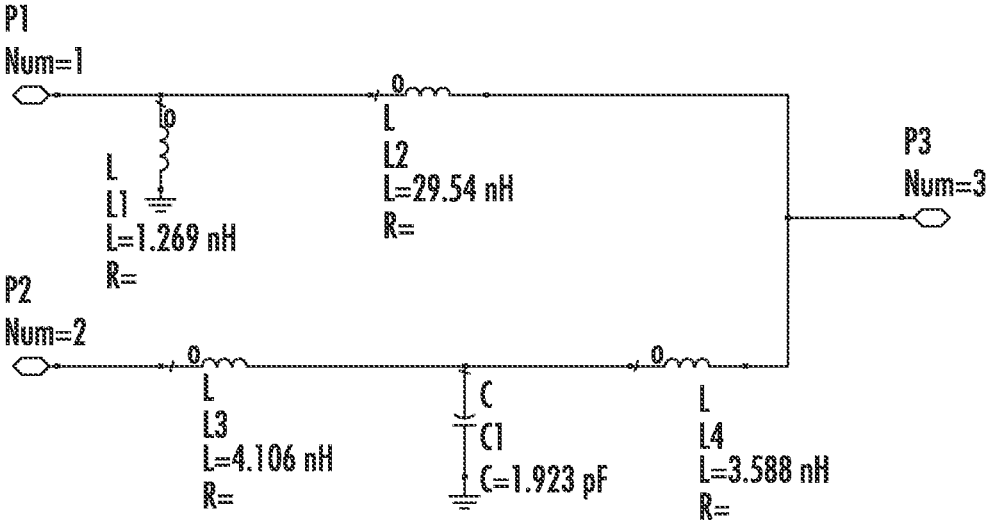
FIG. 17 shows a synthesized combiner circuit for the push-pull HCD amplifier.

FIG. 17 shows a synthesized combiner circuit for the push-pull HCD amplifier. The values can be generated using any appropriate technique for generating the combiner's z-parameters.

Simulation Results

As described above the power enhanced hybrid Chireix-Doherty amplifier was accomplished by breaking up the topology into its main building blocks, the inverse class F main amplifier and class C auxiliary amplifier. Each individual amplifier was studied in single-ended form first and scaled up to its final push-pull configuration. The final simulation results obtained, observations made, and example alternatives for each design proposed are provided below.

Inverse Class F Amplifier—Single-ended configuration

Figure 18:
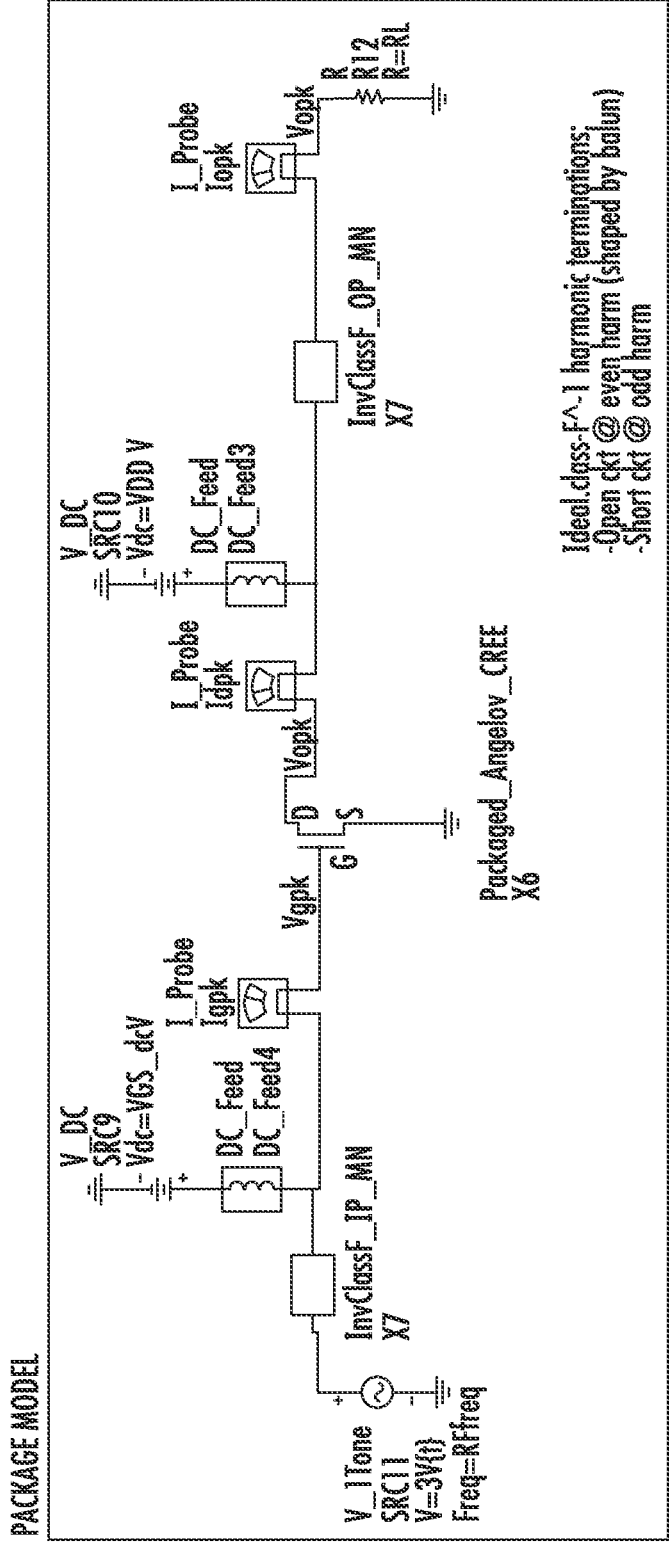
FIG. 18 shows a package model and final design test bench for the inverse class F amplifier.

FIG. 18 shows a package model and final design test bench for the inverse class F amplifier. The embedding test bench is converted by replacing the embedding model with the transistor's package model. The ideal triplexer is replaced with the output MN and the input MN is added to the gate side of the transistor. The final simulation results show good correlation to the projected impedance values on the Smith chart and demonstrate a peak power of 12.8 W with a drain efficiency of 80.1%.

Push-Pull Configuration

Figure 19:
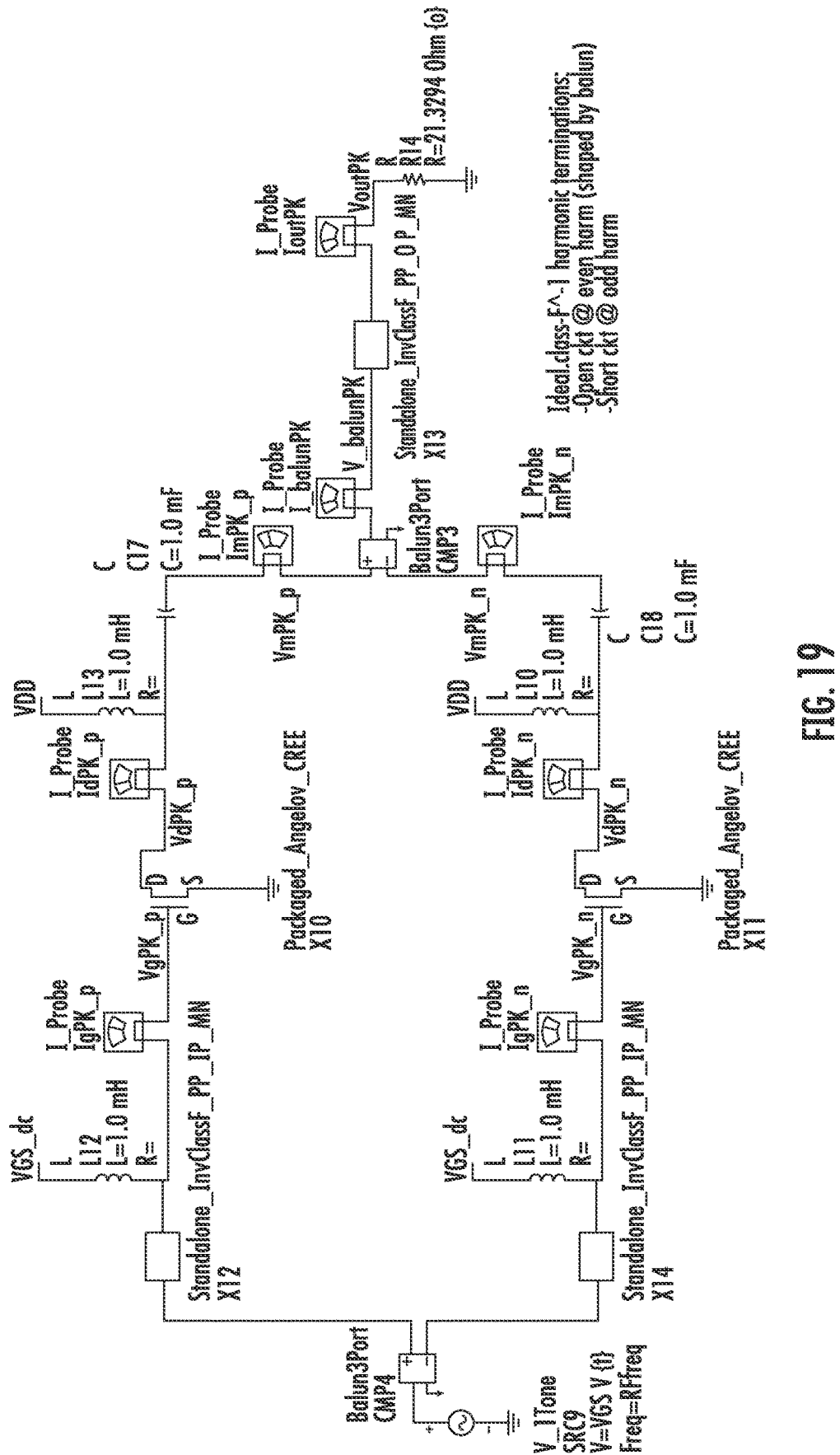
FIG. 19 shows the package model and final design test bench for the push-pull configuration.

FIG. 19 shows the package model and final design test bench for the push-pull configuration. The simulation results for the final implemented push-pull configured inverse class F amplifier achieved 24.8 W of peak output power with a degraded drain efficiency of 66.8%. Investigation found that missing power was being dissipated in the third harmonic at the input MN, which was remedied by adding a shunt open circuit stub to the input MN's topology, together with an additional optimization goal, to short the third harmonic as much as possible.

After implementing a third harmonic trap at the input MN, the performance of the amplifier significantly improved; it achieved a peak output power of 31.7 W and a drain efficiency of 82.6%. The correlation to the projected impedance values and drain current and voltage waveforms also improved. The same third harmonic trap at the input MN was retrofitted to the single-ended design, increasing its output peak power to 14.6 W and drain efficiency to 85.6%.

Class C Amplifier—Single-Ended Configuration

Figure 20:
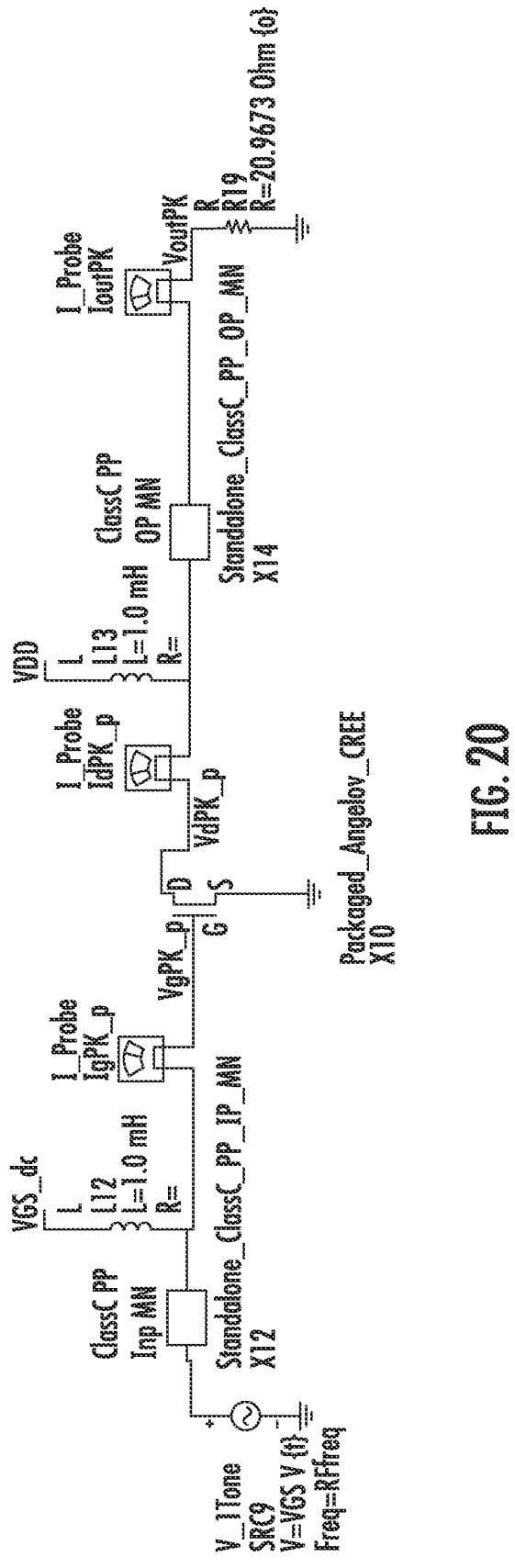
FIG. 20 shows a Class C package model and final design test bench.

FIG. 20 shows a Class C package model and final design test bench. The implemented single-ended class C amplifier correlates its performance fairly well to the projected values of the embedding model. It achieves a peak output power of 18.6 W and a drain efficiency of 67.2%. The peak power is physically not possible since the transistor model that is being simulated is rated at 15 W, so it's assumed the design will be able to make max power. The drain efficiency is only reduced by 2% at the package level and the simulated impedance values are observed to be on target.

Push-Pull Configuration

Figure 21:
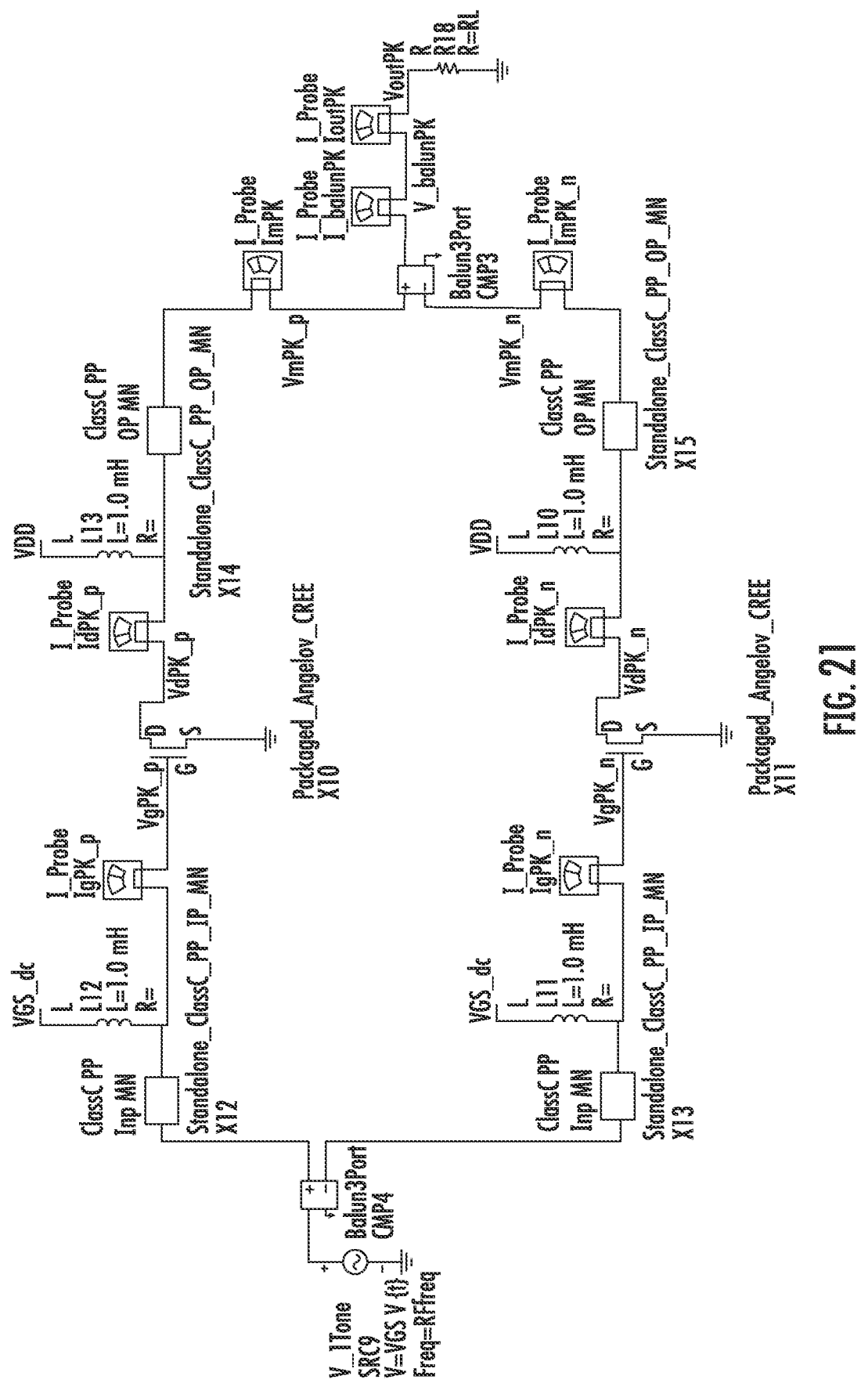
FIG. 21 shows a Class C package model and final design test bench, push-pull configuration.

FIG. 21 shows a Class C package model and final design test bench, push-pull configuration. The output MN is required for each individual branch, which allows for the reuse of the single-ended network. Although further optimization may yield improved results, the performance demonstrated a close correlation to the projected values. The design achieves full peak power (the peak power of each transistor is again greater than physically possible at 18.9 W) with a drain efficiency of 67.1%. The drain efficiency is aligned with the embedding model's projection of 68.5%.

Push-Pull Hybrid Chireix-Doherty Simulation Results

The main and auxiliary amplifier branches are combined to assemble the push-pull Hybrid Chireix-Doherty topology. The bias and MN values previously determined serve as the starting point for a final pass through the ADS optimizer.

The output performance could be improved, so after individual amplifier branches were confirmed to be functional, the combiner was replaced with a differential resistor equal to 2×the main amplifier's load line requirement. There is an impedance mismatch between the main and auxiliary amplifiers' optimal load. The steps taken to remedy these issues were to implement an impedance transformer at the auxiliary amplifier's output, prior to the combiner, and to replace the synthesized combiner circuit with the calculated package Z-parameters in a S2P component.

Figure 22:
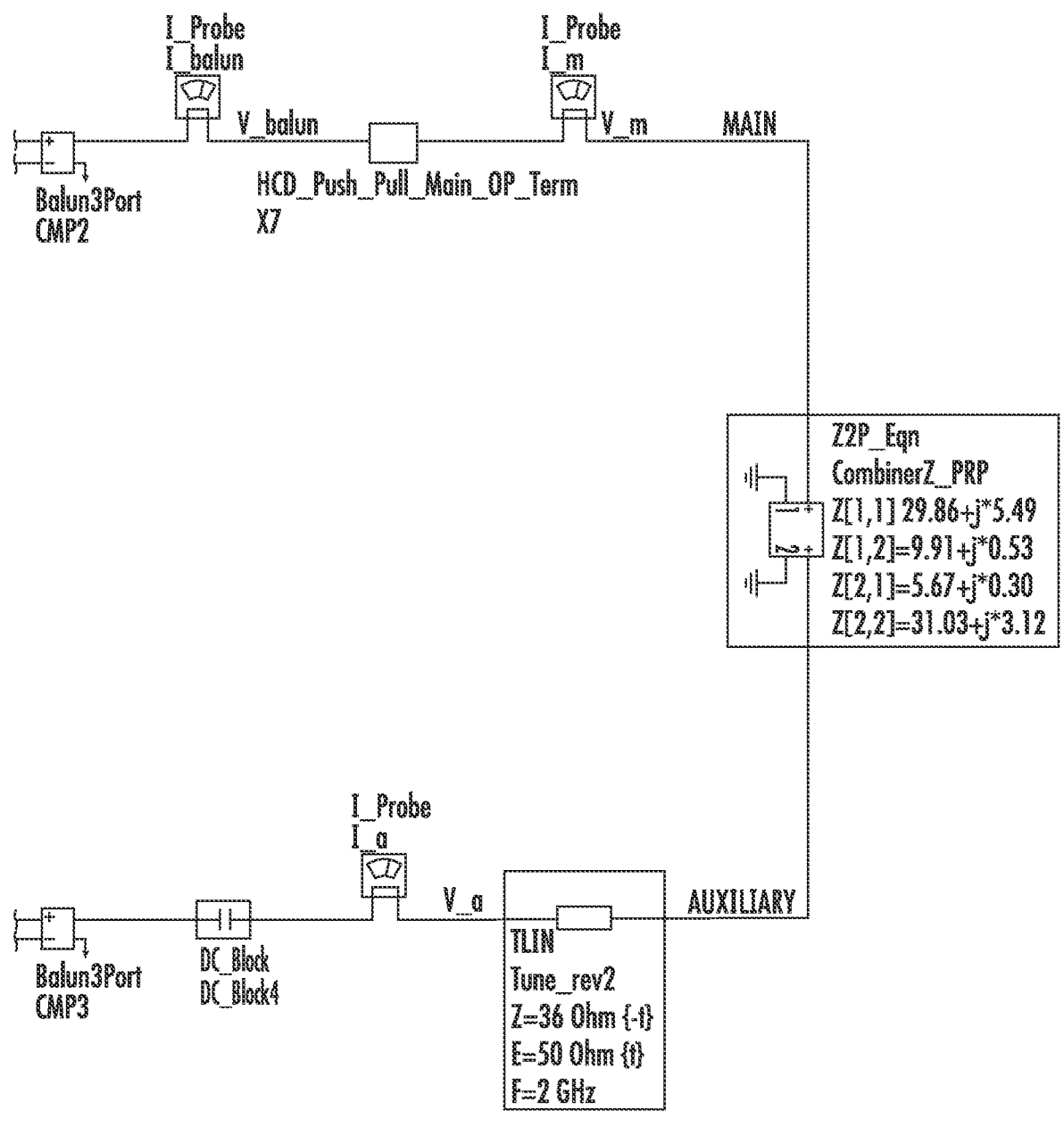
FIG. 22 shows the implemented impedance transformer and combiner network substitute.

FIG. 22 shows the implemented impedance transformer and combiner network substitute. This significantly improved the output performance, and with further tuning of the bias values, demonstrated good results from the completed push-pull Hybrid Chireix-Doherty amplifier.

Bias Values Adjusted for Final Performance.

| Transistor | Design Parameter | Final Tuned Value |
|---|---|---|
| Main | VGG | −2 V |
|  | VDD | 28 V |
| Aux | VGG | −5.8 V |
|  | VDD | 20 V |

Final Simulation Results Discussion

The completed amplifier achieved a peak power of 45.5 dBm with a PBO range of 3 dB yielding 75% drain efficiency. The efficiency dips to 68% at the lowest point, a trend that is expected with this topology, but which is still better than a traditional Doherty. Compared with some conventional systems, the system and design disclosed herein is able to provide 1.75× more power by implementing each amplifier branch as a push-pull configured transistor pair.

The implementation of the main amplifier as inverse class F leveraged the push-pull configuration's inherent cancellation of even harmonics, allowing for a reduction in the main amplifier's output MN requirements, thereby reducing some of the additional complexity and components that would have otherwise been needed. The final PBO range of 3 dB does fall short of the projected 8 dB, the maximum efficiency dip observed between the peak and back-off modes has been reduced to around 1%.

The difference between the calculated ideal and actual PBO range may be due to the main amplifier-its impedance curve at the fundamental frequency is compressed relative to the auxiliary amplifier. The final simulated impedance curves deviate from the embedding model's PRP projection, with the main amplifier being the primary cause.

Although specific examples and features have been described above, these examples and features are not intended to limit the scope of the present disclosure, even where only a single example is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed in this specification (either explicitly or implicitly), or any generalization of features disclosed, whether or not such features or generalizations mitigate any or all of the problems described in this specification. Accordingly, new claims may be formulated during prosecution of this application (or an application claiming priority to this application) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A hybrid Chireix-Doherty (HCD) amplifier operating in inverse class-F comprising:
   a first input network and a second input network;
   a main amplifier coupled to a first output of the first input network;
   an auxiliary amplifier coupled to a second output of the second input network; and
   a combiner network coupled to a first output of the main amplifier and a second output of the auxiliary amplifier, wherein the combiner network comprises an output node for coupling to a load;
   wherein the main amplifier is implemented as an inverse class-F amplifier.

2. The HCD amplifier of claim 1, wherein the main amplifier is implemented in a push-pull configuration.

3. The HCD amplifier of claim 1, wherein the auxiliary amplifier is implemented in a push-pull configuration.

4. The HCD amplifier of claim 1, wherein the auxiliary amplifier is implemented as a class C amplifier.

5. The HCD amplifier of claim 1, wherein the main amplifier or the auxiliary amplifier or both are implemented using one or more GaN transistors.

6. The HCD amplifier of claim 1, wherein the combiner network comprises a Chireix outphasing branch.

7. The HCD amplifier of claim 1, wherein the main amplifier comprises two transistors in a push-pull configuration.

8. The HCD amplifier of claim 1, wherein the combiner network is configured to combine a first output signal from the main amplifier with a second output signal from the auxiliary amplifier.

9. The HCD amplifier of claim 1, comprising a third harmonic trap at an input matching network for the main amplifier.

10. The HCD amplifier of claim 1, comprising an impedance transformer at the output of the auxiliary amplifier.

11. A method for operating a hybrid Chireix-Doherty (HCD) amplifier operating in inverse class-F, the method comprising:
   supplying a radio frequency (RF) input signal to a first input network and a second input network; and
   splitting, by the first and second input networks, the RF input signal into a main amplifier and an auxiliary amplifier;
   combining, by a combiner network, a first output of the main amplifier with a second output of the auxiliary amplifier; and
   outputting, from the combiner network, an amplified output signal to a load;
   wherein the main amplifier is implemented as in inverse class-F amplifier.

12. The method of claim 11, wherein main amplifier is implemented in a push-pull configuration.

13. The method of claim 11, wherein the auxiliary amplifier is implemented in a push-pull configuration.

14. The method of claim 11, wherein the auxiliary amplifier is implemented as a class C amplifier.

15. The method of claim 11, wherein the main amplifier or the auxiliary amplifier or both are implemented using one or more GaN transistors.

16. The method of claim 11, wherein the combiner network comprises a Chireix outphasing branch.

17. The method of claim 11, comprising splitting an input RF signal into two equal components with opposite phase.

18. The method of claim 11, comprising combining a first output signal from the main amplifier with a second output signal from the auxiliary amplifier.

19. A cellular network base station comprising:

an antenna configured for transmitting to remote computing devices; and a hybrid Chireix-Doherty (HCD) amplifier operating in inverse class-F comprising:

a first input network and a second input network;

a main amplifier coupled to a first output of the first input network;

an auxiliary amplifier coupled to a second output of the second input network; and a combiner network coupled to a first output of the main amplifier and a second output of the auxiliary amplifier, wherein the combiner network comprises an output node coupled to the antenna; and wherein the main amplifier is implemented as an inverse class-F amplifier.

20. The cellular network base station of claim 19, wherein the main amplifier is implemented in a push-pull configuration and the auxiliary amplifier is implemented in a push-pull configuration.

\* \* \* \* \*